United States Patent
Schneider

(10) Patent No.: US 7,612,692 B2
(45) Date of Patent: *Nov. 3, 2009

(54) BIDIRECTIONAL CONTEXT MODEL FOR ADAPTIVE COMPRESSION

(75) Inventor: James P. Schneider, Raleigh, NC (US)

(73) Assignee: Red Hat, Inc., Raleigh, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/072,760

(22) Filed: Feb. 27, 2008

(65) Prior Publication Data

US 2009/0212981 A1 Aug. 27, 2009

(51) Int. Cl.
H03M 7/34 (2006.01)
(52) U.S. Cl. .......................................... 341/51; 341/50
(58) Field of Classification Search .................... 341/50, 341/51, 67, 59, 65
See application file for complete search history.

(56) References Cited

U.S. PATENT DOCUMENTS

| | | | | |
|---|---|---|---|---|
| 4,906,991 A | * | 3/1990 | Fiala et al. ..................... | 341/51 |
| 5,796,356 A | * | 8/1998 | Okada et al. ................... | 341/51 |
| 5,844,508 A | * | 12/1998 | Murashita et al. ............. | 341/51 |
| 5,861,827 A | * | 1/1999 | Welch et al. ................... | 341/51 |
| 7,274,671 B2 | * | 9/2007 | Hu .............................. | 370/256 |
| 7,348,899 B2 | * | 3/2008 | Kravtsounov et al. ......... | 341/51 |

* cited by examiner

*Primary Examiner*—Peguy JeanPierre
(74) *Attorney, Agent, or Firm*—Blakely, Sokoloff, Taylor & Zafman LLP

(57) ABSTRACT

Techniques for improving encoding and decoding data are described herein. According to one embodiment, in response to a symbol retrieved from an input stream having a sequence of symbols, it is determined whether a current context can encode the retrieved symbol. A code representing an escape down token in the current context is emitted to a code stream if the current context cannot encode the retrieved symbol. A code representing the retrieved symbol in the current context is emitted to the code stream if the current context can encode the retrieved symbol. Optionally, the current context is escaped to a context having a higher order by emitting a code representing an escape up token in the code stream, where a higher order context is a child context to a lower order context as a parent context.

20 Claims, 32 Drawing Sheets

```
struct Context_Structure
{
    void   *Parent_Pointer;
    void   *Child_Pointer[256];
}
```

FIG. 3

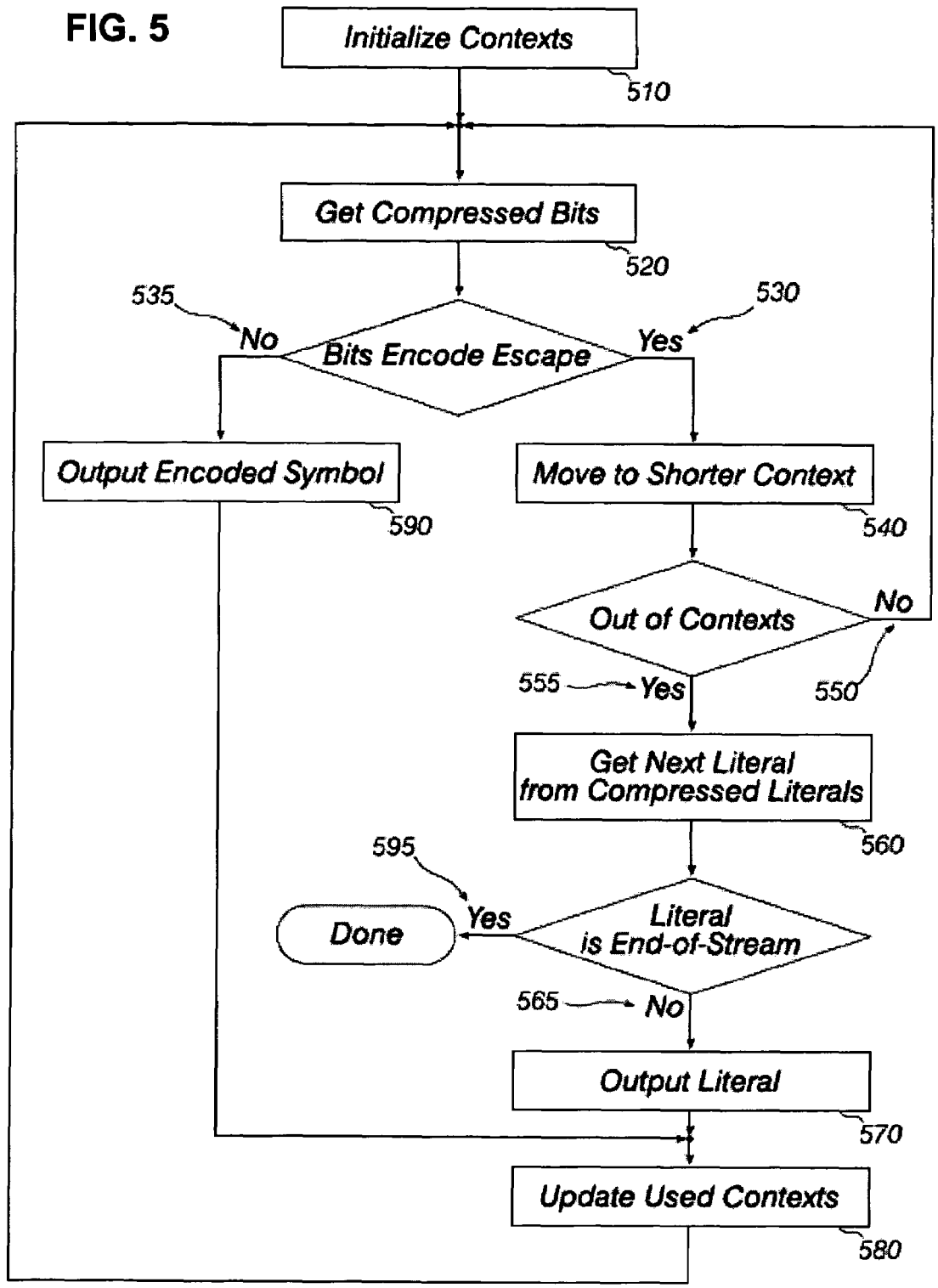

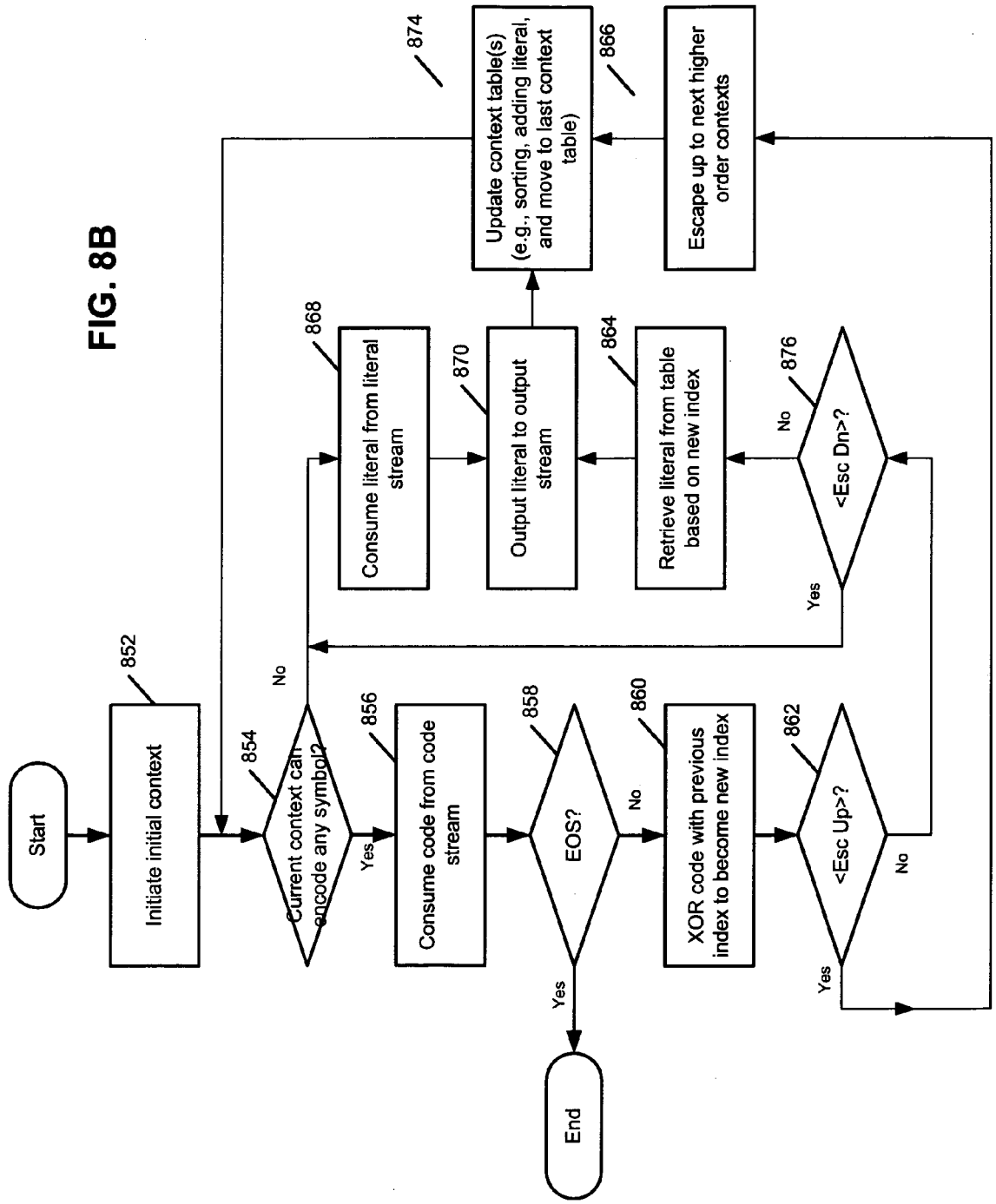

BIDIRECTIONAL CONTEXT MODEL FOR ADAPTIVE COMPRESSION

TECHNICAL FIELD

The present invention relates generally to data compression. More particularly, this invention relates to bidirectional context model for adaptive data compression.

BACKGROUND

Traditional entropy encoding compression algorithms (such as Huffman coding, adaptive Huffman coding or arithmetic coding) depend on having a statistical model of the input stream they are compressing. The more accurately the model represents the actual statistical properties of symbols in the input stream, the better the algorithm is able to compress the stream. Loosely speaking, the model is used to make a prediction about what input symbol will come next in the input stream. For example, if the input stream is English-language text, the model would assign a higher probability to the letter 'e' than to the letter 'Q' (usually). This corresponds physically to making the 'e' segment of the pin longer than the 'Q' segment.

The probability model can be static (i.e., unchanging for the duration of a compression process) or adaptive (i.e., evolving as the compressor processes the input data stream). The probability model can also take into account one or more of the most recently encountered input symbols to take advantage of local correlations. For example, in English text, encountering a letter 'Q' or 'q' in the input stream makes it more likely that the next character will be 'u'.

An adaptive model typically works by matching the current input symbol against its prediction context, and if it finds the current input symbol in its context, generating a code representing the particular probability range that the input symbol represents. For example, if the current input symbol is 'e' and the model predicts that the probability of 'e' is in the range 0.13 to 0.47, then the compressor would generate an output code representing that probability range. Once the symbol is encoded, the compressor updates the probability model. This "code and update" cycle is repeated until there are no more input symbols to compress.

When the compressor encounters a new symbol for which its model has no prediction, it must do something else. What it does is encode a special "escape" symbol to signal to the decompressor that the next symbol is a literal value. This escape-and-literal output has two problems: first, since the literal value will be sent as a whole number of bits (e.g., eight bits), compression algorithms that can send symbols in fractional bits will lose a small amount of compression efficiency when a fractional bit is rounded up to a whole-bit boundary. Second, the fact that these escaped literal symbols failed to match the current probability model provides some residual information that could be used to compress the literals themselves. This compression opportunity is wasted if the literals are distributed throughout the compressed data stream wherever the unmatched symbols happen to appear. Compression algorithm modifications to plug these efficiency "leaks" may be able to improve overall compression performance.

BRIEF DESCRIPTION OF THE DRAWINGS

The present invention is illustrated by way of example and not limitation in the figures of the accompanying drawings in which like references indicate similar elements.

FIGS. 3-4 are data structures which may be used for encoding and decoding processes according to one embodiment of the invention.

FIG. 5 is a flow diagram outlining decompression according to an embodiment of the invention.

FIGS. 7A-7L are data diagrams illustrating a decoding process according to one embodiment of the invention.

FIGS. 8A-8B are flow diagrams illustrating examples of encoding and decoding processes according to certain embodiments of the invention.

DETAILED DESCRIPTION

In the following description, numerous details are set forth to provide a more thorough explanation of the embodiments of the present invention. It will be apparent, however, to one skilled in the art, that embodiments of the present invention may be practiced without these specific details. In other instances, well-known structures and devices are shown in block diagram form, rather than in detail, in order to avoid obscuring embodiments of the present invention.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification do not necessarily all refer to the same embodiment.

Figure 1:
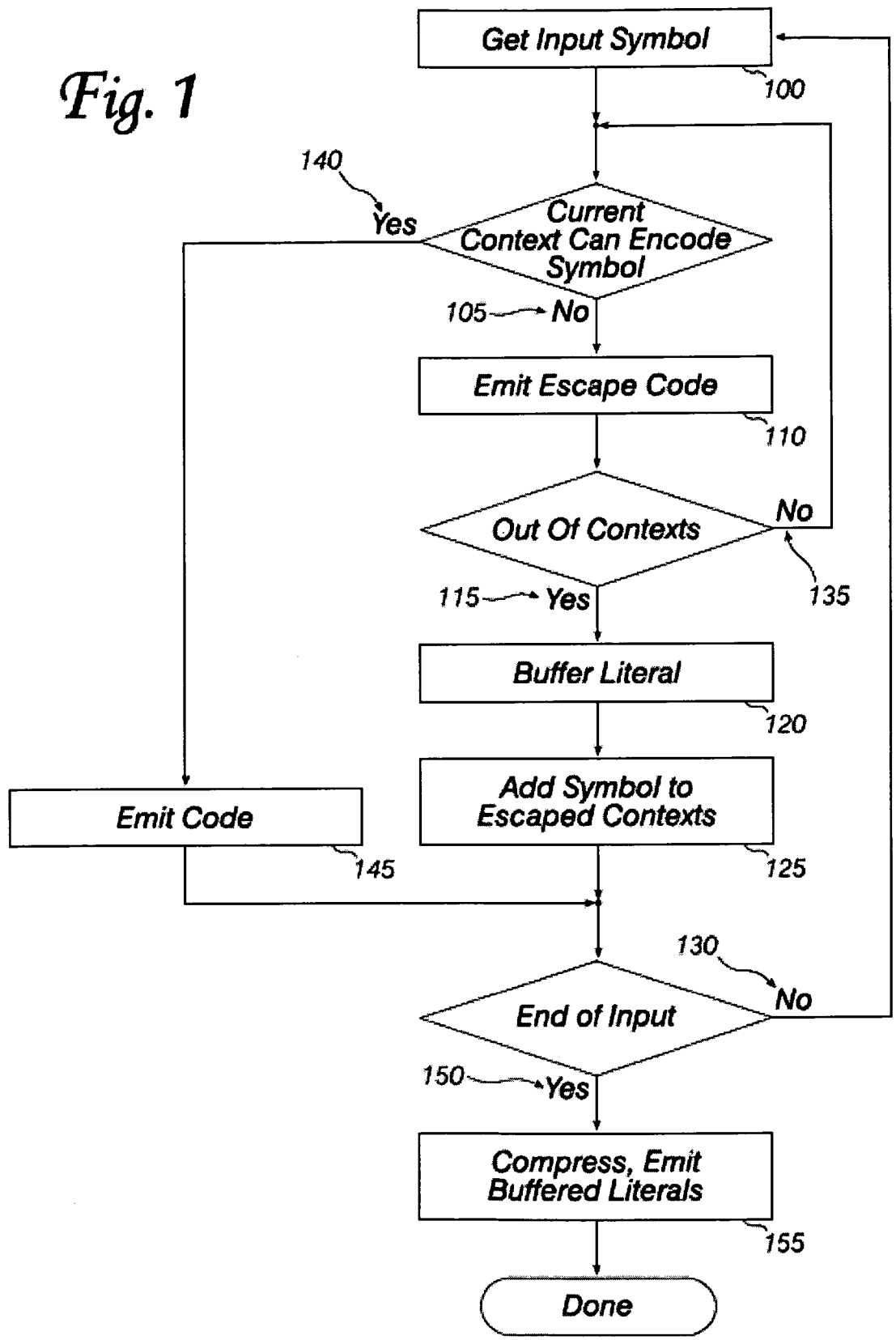
FIG. 1 shows an overview of an adaptive coding compression process according to an embodiment of the invention.
Figure 2:
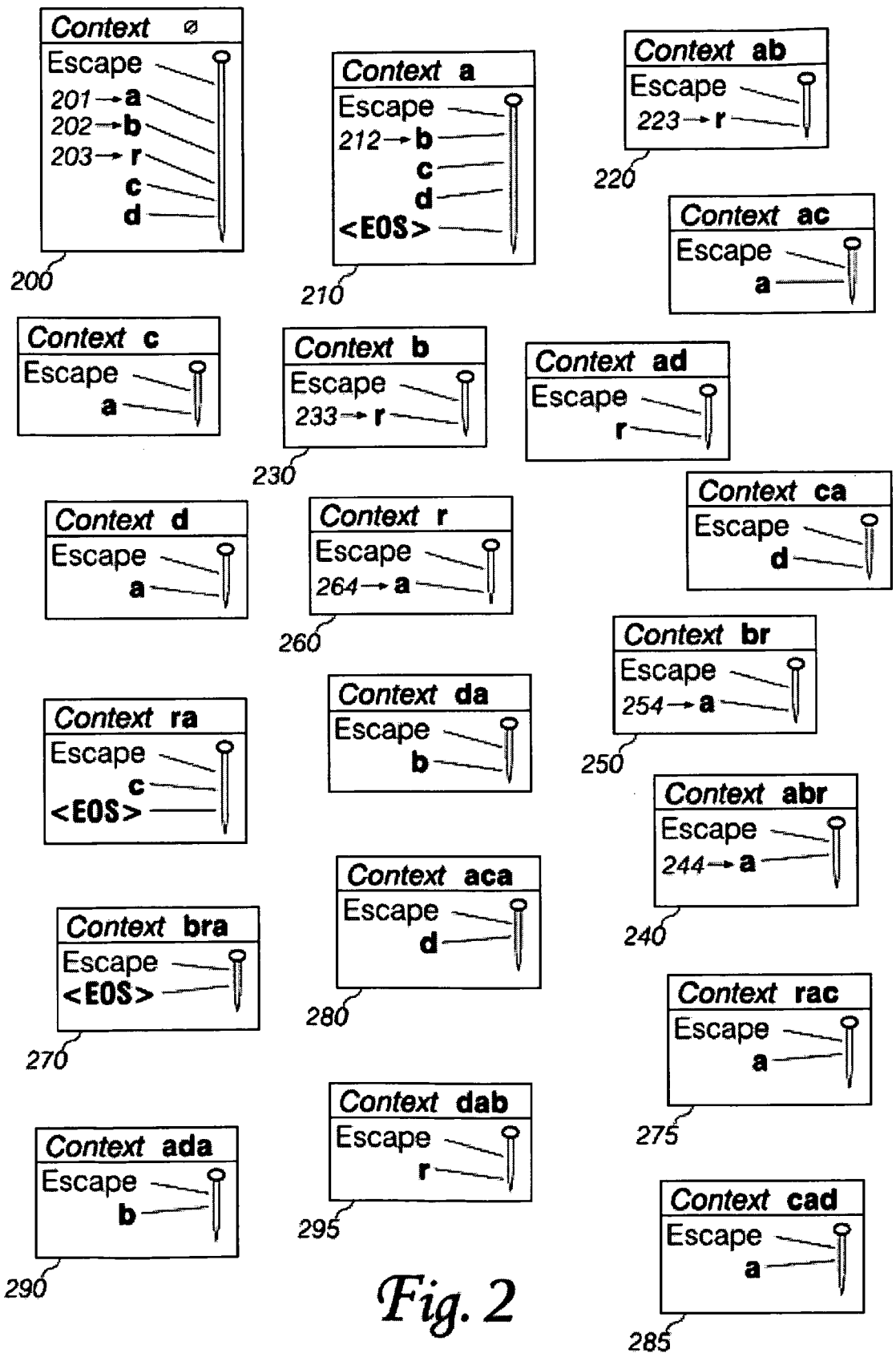
FIG. 2 shows the three-symbol contexts that are created as an embodiment of the invention compresses the string "abracadabra".

FIG. 1 is a flow diagram illustrating operations of an adaptive entropy coding compressor according to one embodiment of the invention. The following explanation will track the compressor through the flow chart as it processes an input string, "abracadabra". Compression can be thought of as building a model of the input data and picking a minimal set of clues about the model to send to a decompressor, so that the decompressor can replicate the model and reproduce the input string. FIG. 2 shows "contexts" of the model according to certain embodiments of the invention. Each context corresponds to symbols the compressor has recently encoded (or symbols the decompressor has recently recovered). The compressor examined in this example uses three-symbol contexts (i.e., each context corresponds to the up to three most-recently-encountered input symbols). Shorter contexts (two-character, one-character, and no-character contexts) also appear in the model, which may be a parent of a longer context (e.g., next order context) in a tree structure. All the contexts together make up a probability model that, in some sense, represents estimates of the likelihood that a particular symbol will be seen at a certain point in the input.

The information in a context can be thought of as a map to sub-segments of a part of a pin. A fully-populated context would have entries giving the length of the pin-segment allocated to each corresponding input symbol. However, since this is an adaptive compressor, each context starts out empty (rather than divided into twenty-six segments for each letter or 256 segments for each possible eight-bit symbol). As input symbols are encountered, contexts add segments and/or adjust the boundaries between segments so that the context can efficiently encode the input.

According to one embodiment, as an example of an implementation, each context may be defined as a data structure as shown in FIG. 3. Referring to FIG. 3, each context includes a parent pointer pointing to a parent context of the current context (e.g., a shorter context). The root context would have the parent pointer as NULL or zero since it does not have any parent. Each context may also include one or more child contexts (e.g., longer contexts or next order contexts), where number of the child contexts depends on a specific application or configuration. In this example, it is assumed that there are 256 different symbols plus two escape symbols: an escape up token and an escape down token. Note that the data structure as shown in FIG. 3 is described for purposes of illustration only. Other formats or configurations may also exist.

Although all of the contexts, and the symbols each can encode, are shown in FIG. 2, they accumulate over time (as described below). The model starts out empty, with the initial context 200 (e.g., context "" as a root context) able to encode only an escape symbol. The escape symbol is distinct from the 256 possible symbols that could be present in a stream of eight-bit characters.

The compressor retrieves the first input symbol (block 100), a. The current context, 200, cannot (yet) encode a (block 105) so the compressor emits an escape token (block 110) and moves to a shorter context. Since context 200 is the shortest (zero-character) context, the compressor is out of contexts (block 115). It buffers the literal a (120) and adds a to each of the escaped contexts (block 125). (Element 201 indicates the a added to context 200.) The compressor has not reached the end of its input (block 130), so it loops back to get the next input symbol (block 100).

Figure 4:
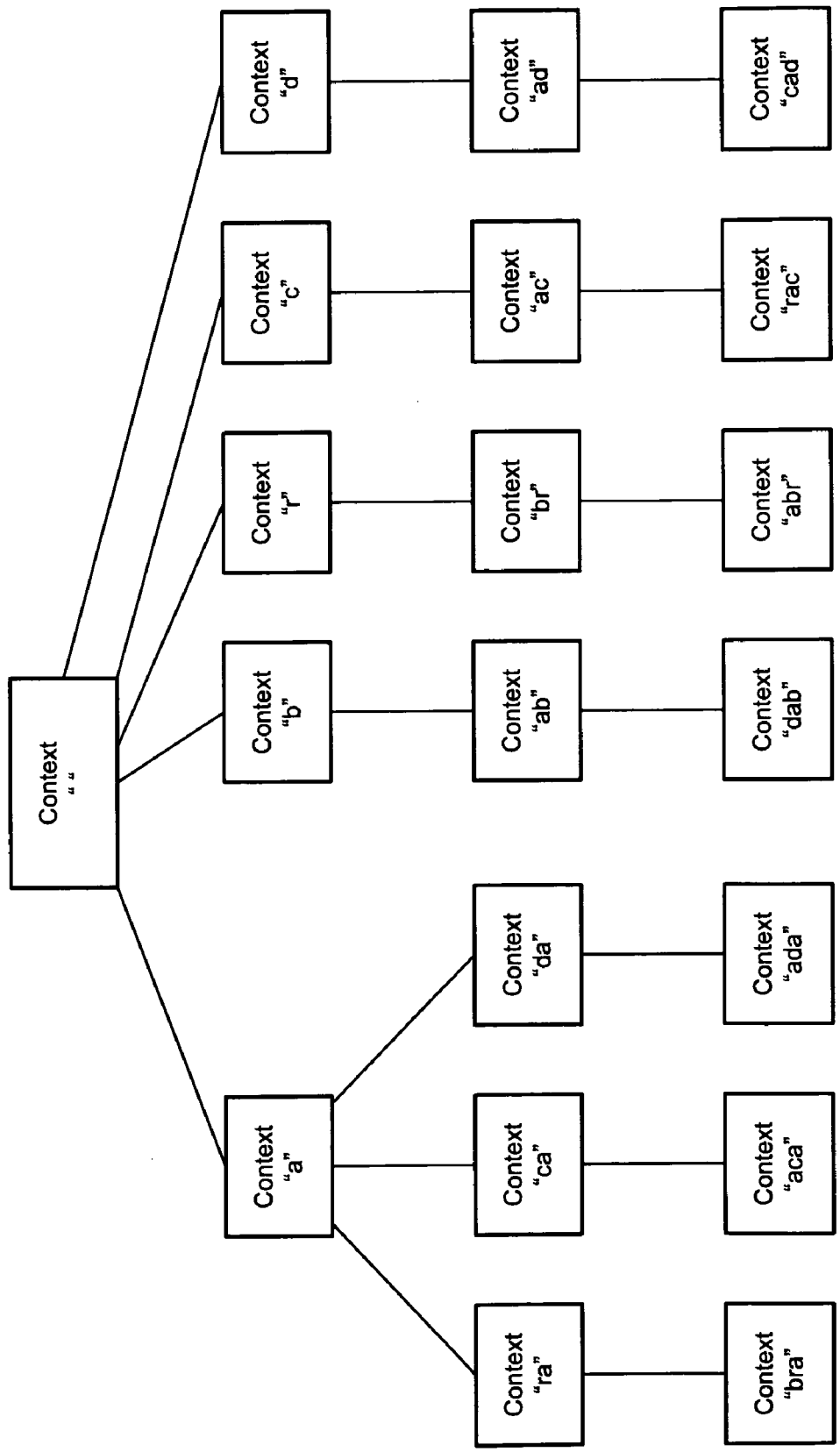

In practice, a child context is created having a parent pointer pointing to context 200 while context 200 has a child pointer pointing to the newly created child context, forming a tree structure similar to the one as shown in FIG. 4. In this example, context 210 (e.g., context "a") is created from context 200, where context "a" includes a parent pointer pointing to context 200 while context 200 includes a child pointer pointing to context "a", as shown in FIG. 4. At this point, context "a" can only encode an escape symbol, also referred to as "<Esc>" symbol, which may be considered implicit <Esc> symbol.

The next symbol is b, and the compressor starts with the last context corresponding to the last symbol which is context "a" (block 210). Since context 210 cannot (yet) encode b (block 105), the compressor emits an escape token (block 110) and moves (e.g., escapes) to a shorter context, which is context 200 (e.g., the parent context of context "a") as shown in FIG. 4. The next-shortest context is 200, so the compressor is not out of contexts (block 135) and loops back to consider context 200. Context 200 is also unable to encode b (block 105) (it can currently encode only escape and a), so the compressor emits another escape token (block 110) and moves to a shorter context. Again, context 200 is the shortest context, so the compressor is out of contexts (block 115). The literal, b, is buffered and also added to each escaped context (blocks 202, 212). So far, the compressor has emitted three escapes and buffered two literals. Only the escape from context 200 on input symbol b required any bits to encode; all the other escapes were from contexts that could only encode the escape.

The next symbol is r and the starting context is ab (block 220), which corresponds to the last context with respect to "r" (e.g., for sequence of "abr" the last context having up to three symbols is context "ab"). Context 220 cannot encode r (block 105), so the compressor emits an escape token (block 110) and moves to shorter context b (block 230) (e.g., parent context of context "b" as shown in FIG. 4). Context 230 also cannot encode r (block 105), so the compressor emits another escape token (block 110) and moves to shorter context 200. Context 200 cannot encode r (block 105), so the compressor emits another escape token (block 110) but is out of contexts (block 115), which in turns creates a child context "r", etc. Literal r is buffered and added to contexts 200, 220 and 230 (see 203, 223 and 233). The end of the input has still not been reached (block 130), so the compressor loops back yet again.

For the next input symbol, a, the compressor starts at context 240 and escapes through 240, 250 and 260 (adding coding 244, 254 and 264) before discovering that context 200 can encode the input symbol (block 140). Therefore, the compressor emits the appropriate code (block 145) and loops back again.

The following table summarizes the activity of the compressor working through the input string. "<EOS>" signifies the end of the string. "Escapes" is the number of contexts escaped from before a context that can encode the current symbol is found, or a literal must be buffered. "Coding Context" identifies the context that was able to encode a symbol, while "Literal" indicates that the compressor buffered a literal and updated one or more escaped-from contexts.

TABLE 1

| Symbol | Start Context | Escapes | Coding Context | Literal |
| --- | --- | --- | --- | --- |
| a | 200 Ø | 1 | | a |
| b | 210 a | 2 | | b |
| r | 220 ab | 3 | | r |
| a | 240 abr | 3 | 200 | |
| c | 270 bra | 4 | | c |
| a | 275 rac | 3 | 200 | |
| d | 280 aca | 4 | | d |
| a | 285 cad | 3 | 200 | |
| b | 290 ada | 3 | 200 | |
| r | 295 dab | 3 | 200 | |
| a | 240 abr | | 240 | |
| <EOS> | 270 bra | 4 | | <EOS> |

After escaping from context 270 and buffering the end-of-stream (EOS) literal, the compressor determines that the end of input has been reached (block 150). Now, it compresses the buffered literals and emits them in a discernible position relative to the encoded data bits (for example, at the beginning of the encoded stream, at the end of the stream, or at a block boundary in the stream). Concerns affecting the placement of the buffered, compressed literals are discussed below.

FIG. 5 is a flow diagram outlining the operations of an entropy coding data decompressor according to an embodiment of the invention. Referring to FIG. 5, the decompressor initializes its context model identically to the compressor's initialized model (block 510). Recall that despite the large number of contexts (shown in FIG. 2) that exist after compressing an input stream, the compressor and decompressor start with just one state, 200, that can encode just one symbol, escape.

Next, the decompressor gets some compressed bits from the compressed data stream. The number of compressed bits necessary to decide what to do next varies from time to time, depending on the state of the decompression context. For example, when decompression has just started and context 200 can only encode escape, no bits are required—the decompressor knows that the compressor must have emitted an escape, because that is the only thing it could emit. Consequently, the escape is encoded in zero bits.

Since the first compressed bits encode escape (block 530), the decompressor moves to a shorter context (block 540). However, since context 200 is already the shortest context, the decompressor is out of contexts (block 555) and requires a literal. It obtains the next literal from the literal decompressor (block 560), checks to ensure that it has not reached the end-of-stream (block 565) and outputs the literal as the reconstituted data (block 570). Referring to Table 1, it is clear that the first compressed literal was a, so that symbol is output.

Any contexts used (e.g., escaped from) are updated (block 580), and the decompressor loops back to get more compressed bits (block 520). (Again, no compressed bits have been used yet, because no existing context could encode anything except Escape.)

Now, the decompressor is in context 210, because it has just produced the symbol a. Context 210 is unable to encode any symbol except escape, so the decompressor again consumes zero bits to determine that the next encoded symbol is escape (block 530). Now, the decompressor moves to the next-shorter context (block 540), which is context 200. It is not out of contexts (block 550), so it loops back to get more compressed bits (block 520).

Context 200 currently encodes escape and a, so some information (at least a portion of a compressed bit) is required to decide which. This compressed bit encodes another escape (block 530). This is the third escape mentioned above. The decompressor moves to a shorter context (block 540) and runs out of contexts (555), so it gets the next literal from the compressed literals (block 560), notes that it is not end-of-stream (block 565), and outputs it (block 570). Recall that the second literal produced during compression was b. The contexts escaped from (210, 200) are updated (block 580) and the decompressor loops back again.

This process continues until the characters abr have been recovered and output. The decompressor is in state 240 and gets some more compressed bits (block 520). States 240, 250 and 260 only encode escapes, so no bits are consumed as the decompressor escapes to shorter contexts. When it reaches context 240, it discovers that the next compressed bits encode a (block 535), so it outputs this symbol (block 590), updates the appropriate contexts (580) and loops back to process more compressed bits.

The decompressor continues working through the compressed bits, extracting literals as necessary from the compressed literals block, until there are no more compressed bits to examine. At this point, the original input symbol sequence has been reconstituted and emitted.

Note that the decompression process requires literals from the compressed block fairly early in its operations (in fact, the very first thing it does is infer an escape from zero compressed bits, extract a compressed literal and output it). Thus, it is important for the decompressor to have access to the compressed literals as soon as possible. If the decompressor has access to the entire compressed data stream, then it can use the dual-file-pointer method depicted to access the literals as necessary. However, if the decompressor is receiving the compressed data stream from a non-seekable source, it must buffer the data until it can determine where the compressed literals are. Further detailed information regarding the techniques set forth above can be found in a co-pending U.S. patent application Ser. No. 11/948,954, filed Nov. 30, 2007, which is incorporated by reference herein.

According to certain embodiments of the invention, the above data compression techniques may be further improved by optimizing context tables, such as, for example, by moving the latest occurred symbol entry up front in the table or moving highest frequently occurred symbol up front in the table, and using the index corresponding symbols to be coded in a code stream in order to further optimize encoding and decoding processes while maintaining the size of the data stream as minimum. In addition, the coding methods can be further improved using a bidirectional coding context model which includes an escape down and an escape up between a lower order context and a higher order context.

FIGS. 6A-6L are block diagrams illustrating an encoding process according to one embodiment of the invention. Referring to FIGS. 3-4, 6A-6L, and 8A, it is assumed that, as an example, an input stream of "abracadabra" is to be encoded into a code stream and a literal stream, which may be compressed using a variety of compressors. Note that process as shown in FIGS. 6A-6L and 8A may be performed by an encoder which may include software, hardware, or a combination of both.

Figure 6A:
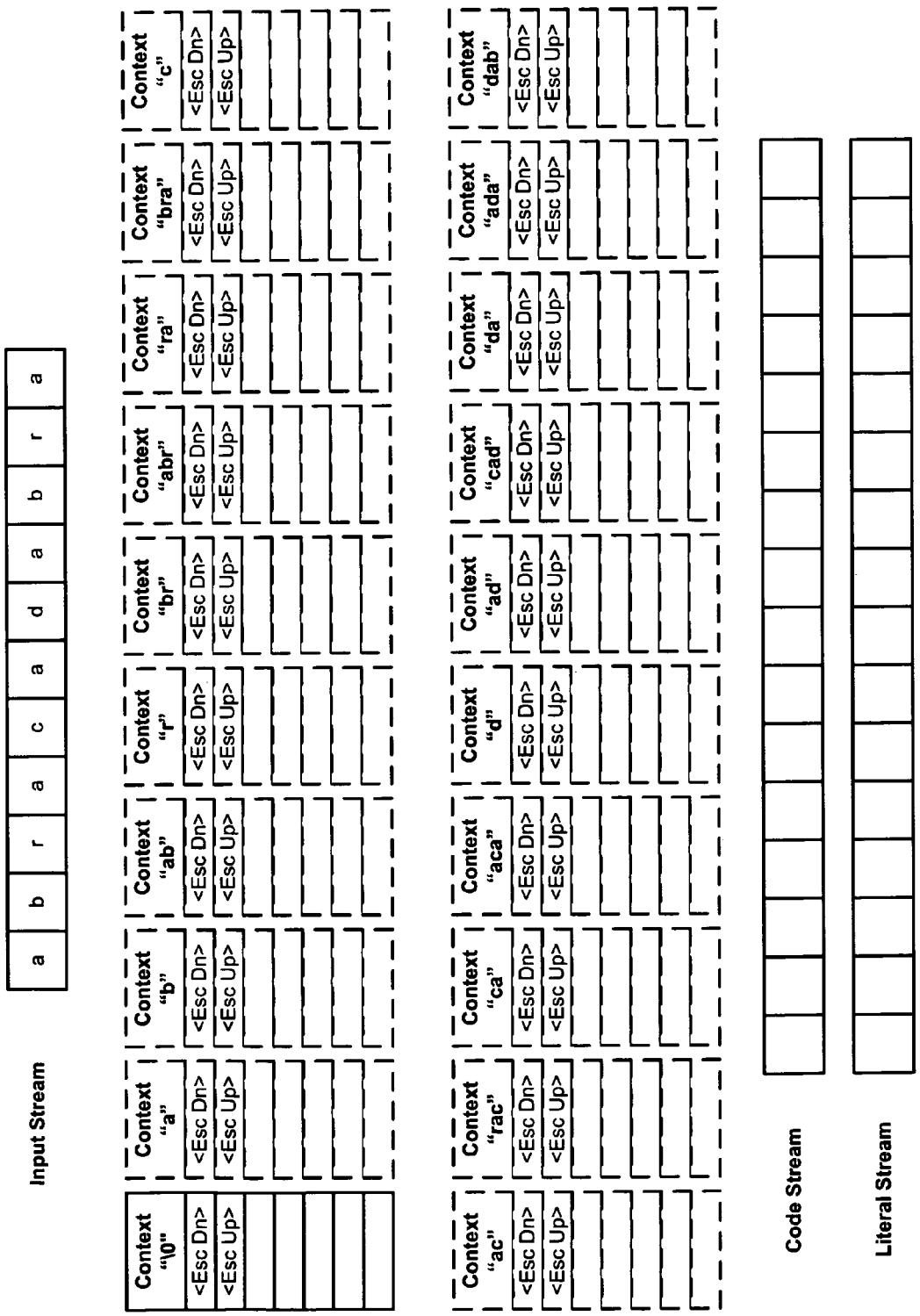
FIGS. 6A-6L are data diagrams illustrating an encoding process according to one embodiment of the invention.

In one embodiment, as shown in FIGS. 6A-6L, an escape down token (also referred to as <Esc Dn>) and an escape up token (also referred to as <Esc Up>) are utilized. Note that an <Esc Up> may be implicit as the last entry or alternatively, it may be an explicit entry. Initially, a root context (also referred to as context "\0" or context "") is initialized only having an <Esc Dn> and an <Esc Up>, where the <Esc Up> may be implicit, as shown in FIG. 6A. Note that at this point, only the root context exists (as indicated with solid lines) while the rest do not exist yet (as indicated with dash lines).

Figure 6B:
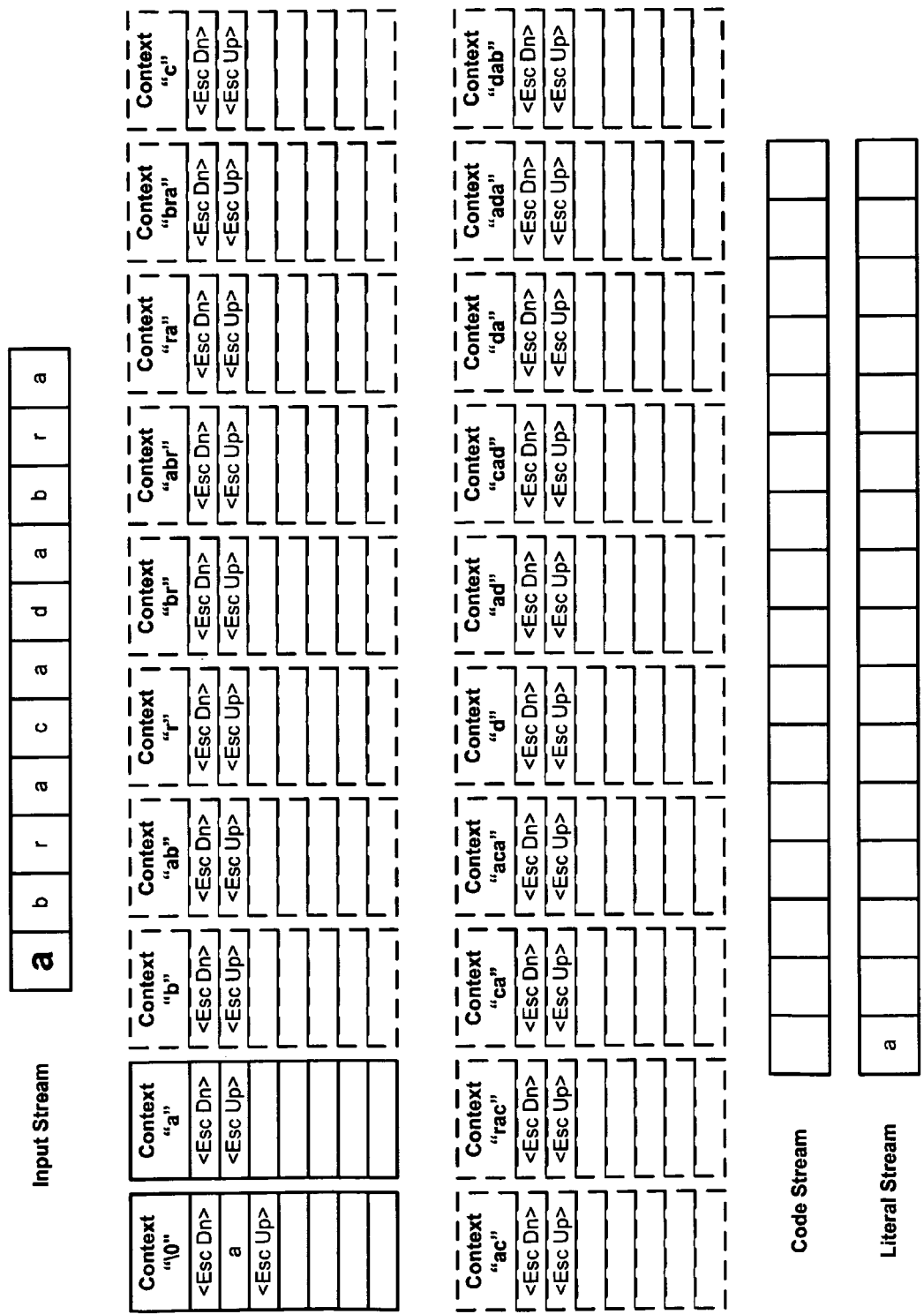

Starting with the first symbol "a" (e.g., *a*bracadabra), since context "" cannot encode anything other than the escape down and/or escape up tokens, "a" is emitted to the literal stream if the current context is a root context (blocks 806, 824, and 818); otherwise escape token is emitted which may be implicit. In addition, "a" is added to the context "" and a child context "a" is created (block 812). Since the escape down is implicit at this point, no code is generated, as shown in FIG. 6B. Note that the escape up to a higher order context potentially exists in all but the longest context.

Figure 6C:
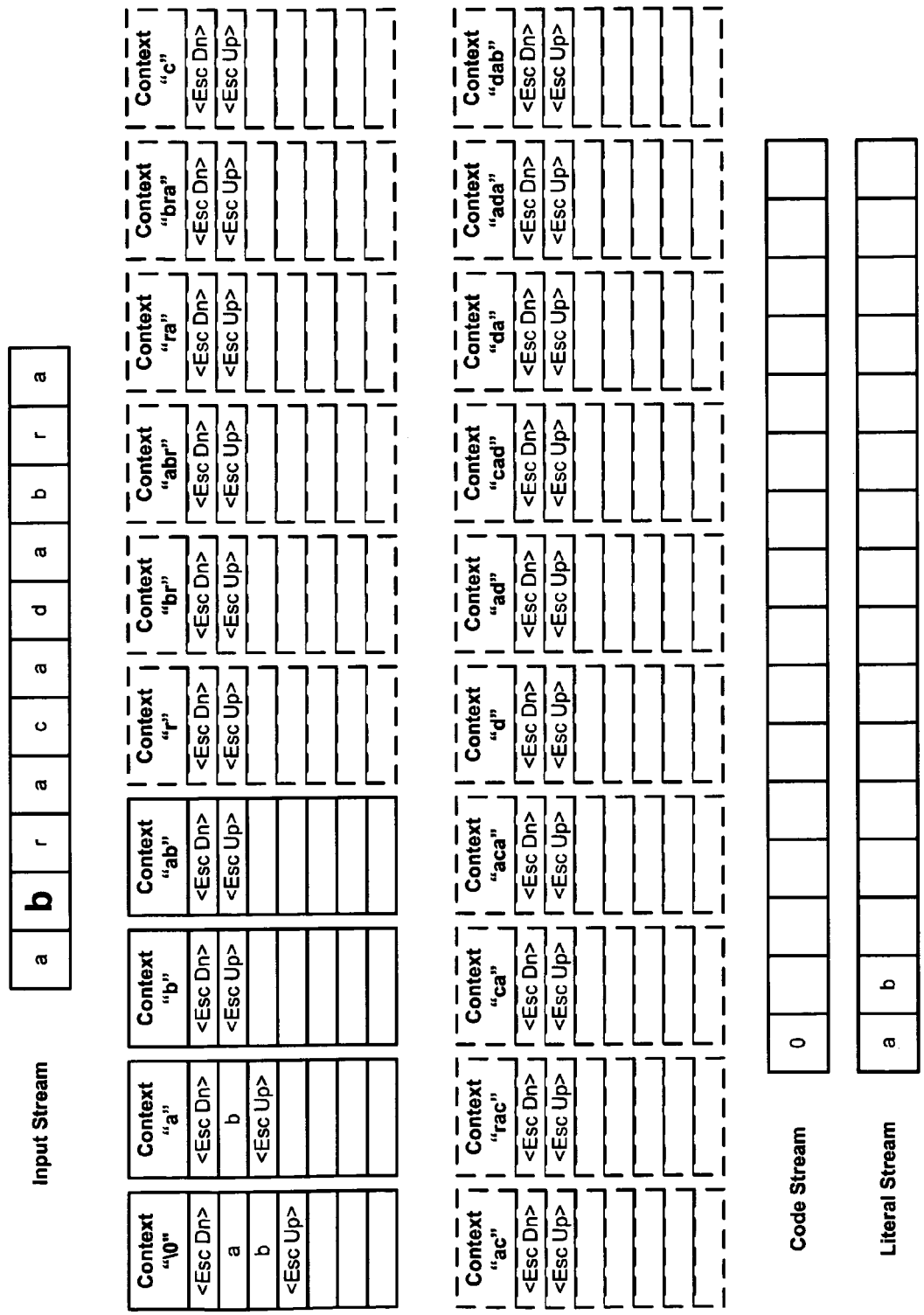

The next symbol from the input stream is "b" (block 802). In this embodiment, the encoder stays at the same order (e.g., order zero) until it is "escaped up" to a higher order. Thus, the encoder stays with context "". As can be seen, context "" can encode something other than an escape token, but cannot encode "b" (blocks 806 and 808). As a result, at block 820, a code representing an escape is generated by XORing an index of the escape down token (e.g., index zero) with a previous index (index zero) to the code stream at block 818. The code stream is now "0" and the literal stream is now "ab". This also updates the "" and "a" context tables, and introduces the "b" and "ab" context tables (block 812) as shown in FIG. 6C.

Figure 6D:
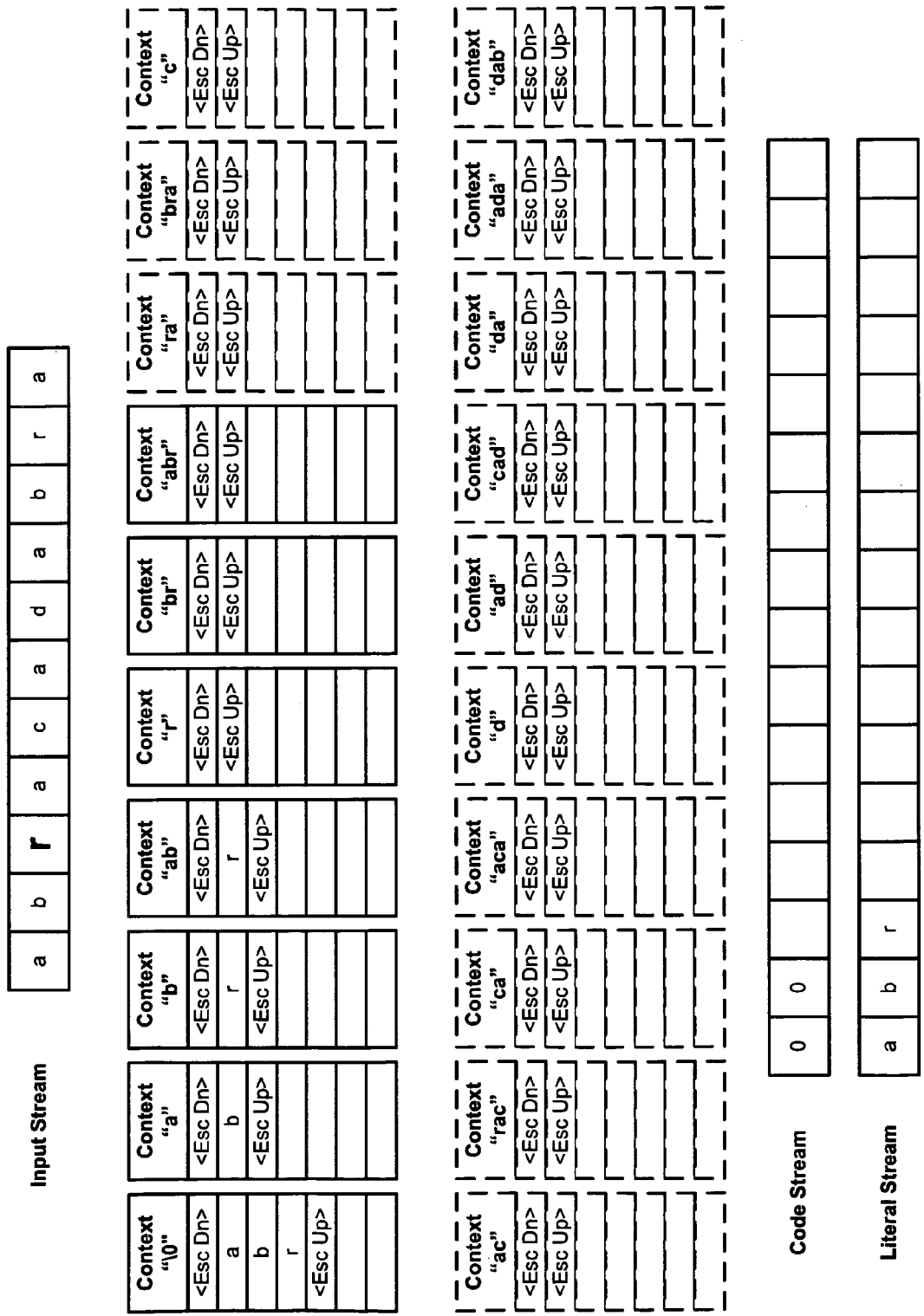

Since we have not escaped up yet and thus, the encoder stays with order zero context "". The next symbol is "r" (e.g., ab*r*acadabra). Again, there is no match in the context. The escape down code (index 0, code 0) is generated, and the "r" is added to the literals. The code stream is "00" and the literal stream is "abr", as shown in FIG. 6D.

Figure 6E:
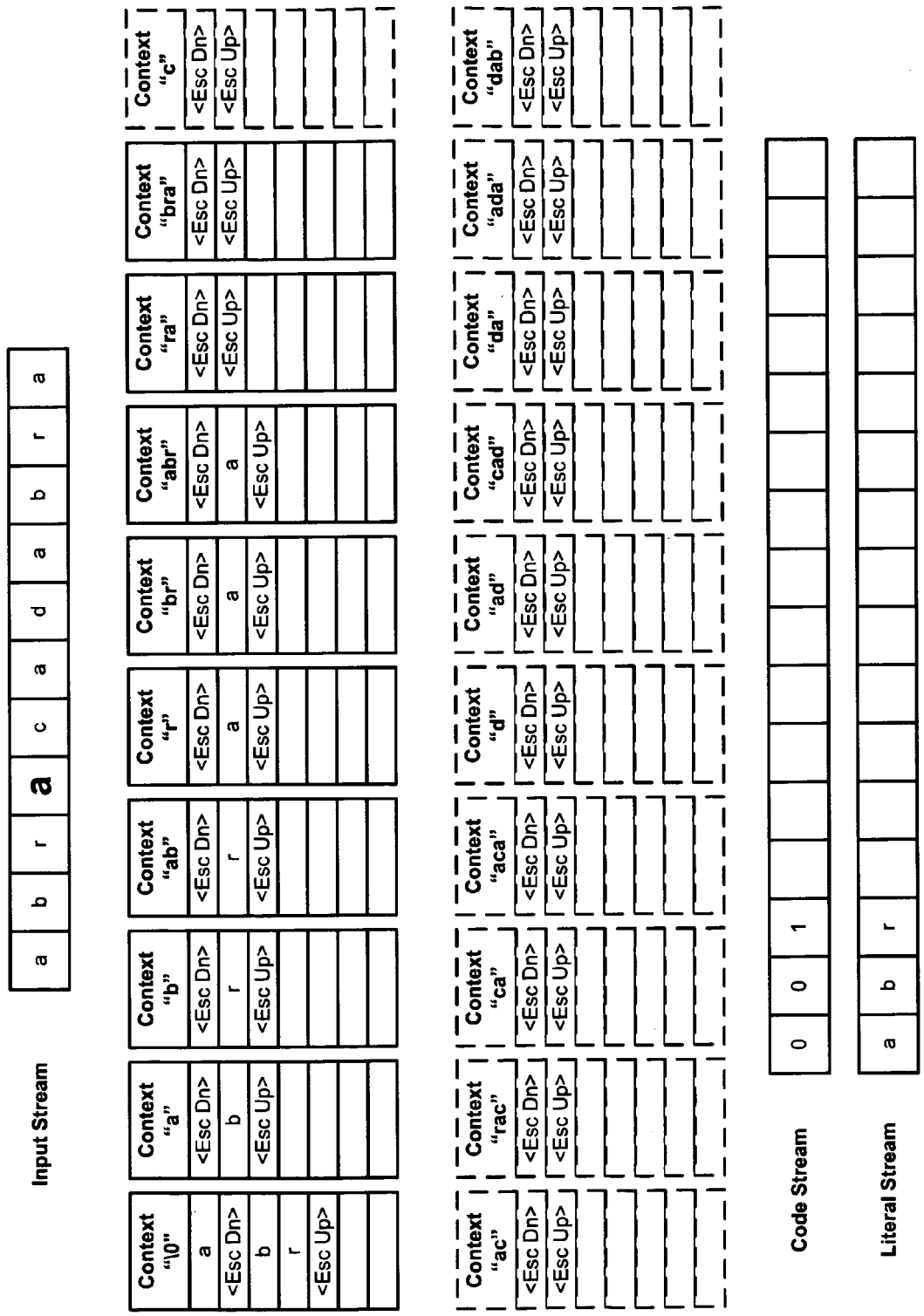

We now come to next symbol of "a" (e.g., abr*a*cadabra). For this one, there is a match in the "" context, so we generate a code of 1 (index of 1, XOR previous index of 0). The code stream is now "001", and the literals stream is "abr". In addition, the context "" table is sorted (e.g., moving "a" entry up front at index 0), as shown in FIG. 6E.

Figure 6F:
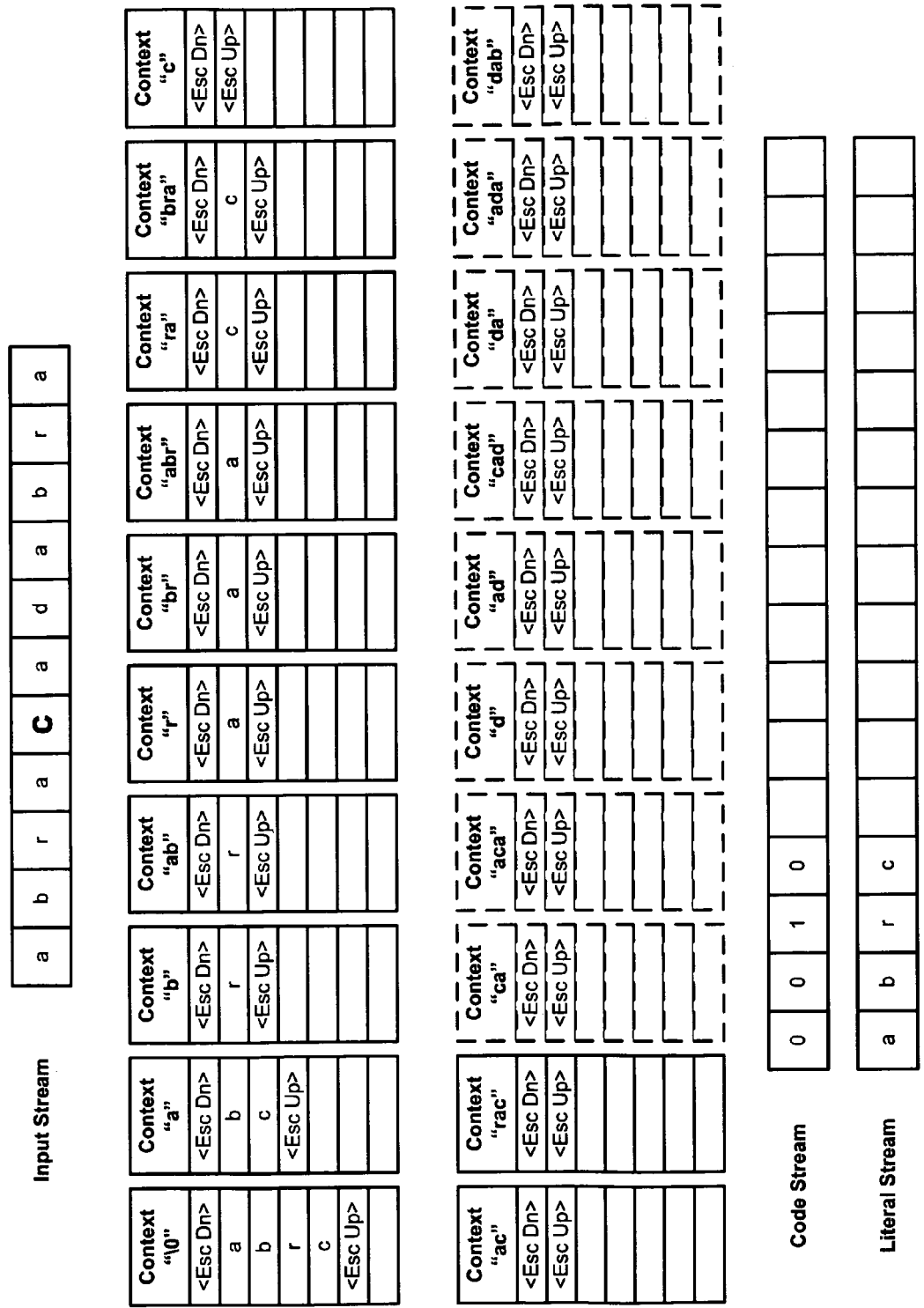

Now, we are at the next symbol "c" (e.g., abra*c*adabra). Since context "" cannot encode "c", the encoder needs to escape for this, generating a code of 0 (previous index of 1 XOR current index of 1). Code stream is now 0-0-1-0 and the literals stream is "abrc" as shown in FIG. 6F.

Now, we are at the next symbol "a" (e.g., abrac*a*dabra). Symbol "a" in the "" context is at index 1, so the code is 0

Figure 6G:
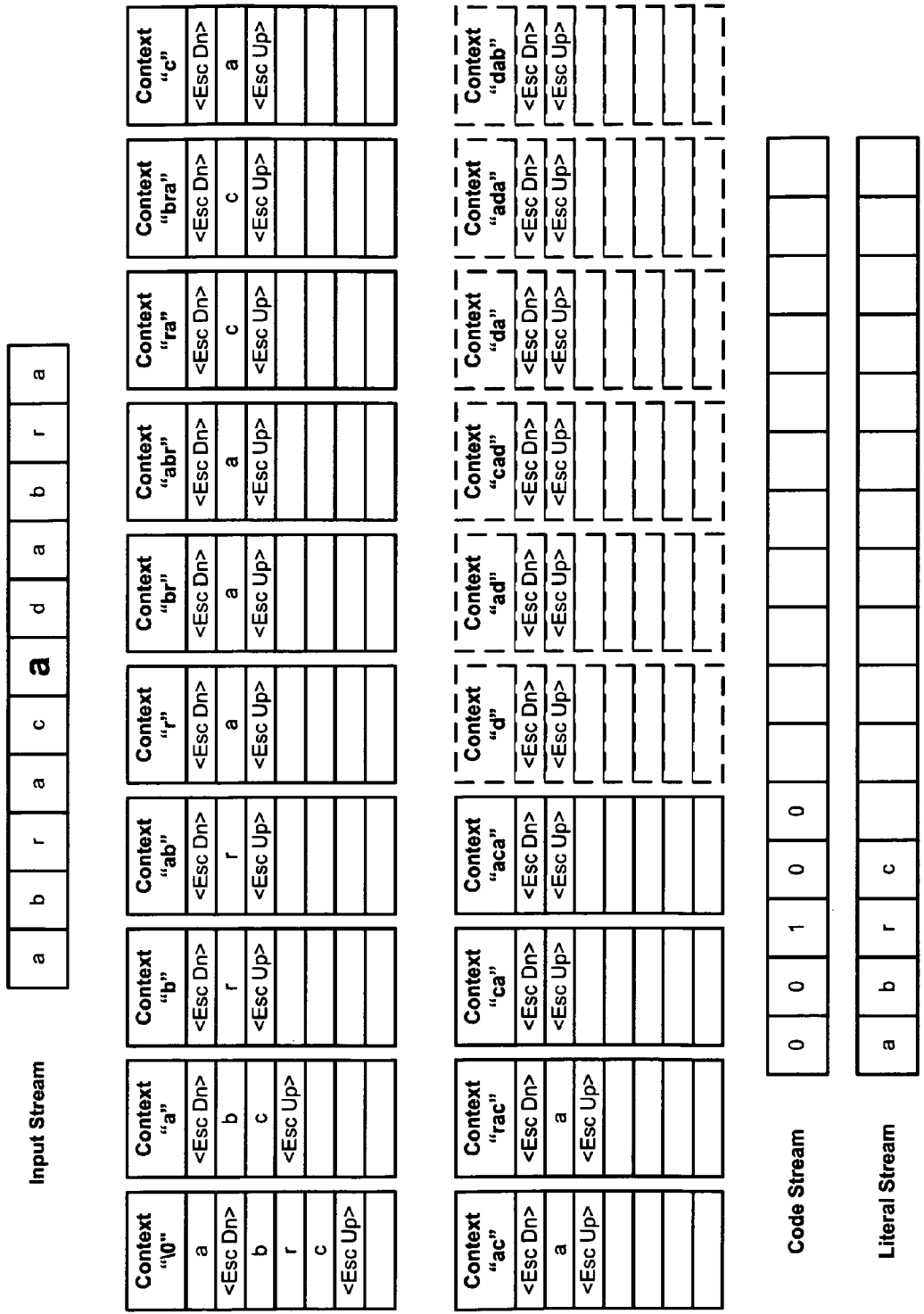

(previous index of 1 XOR current index of 1). Code stream is now 0-0-1-0-0 and the literals stream is still "abrc" as shown in FIG. 6G.

Figure 6H:
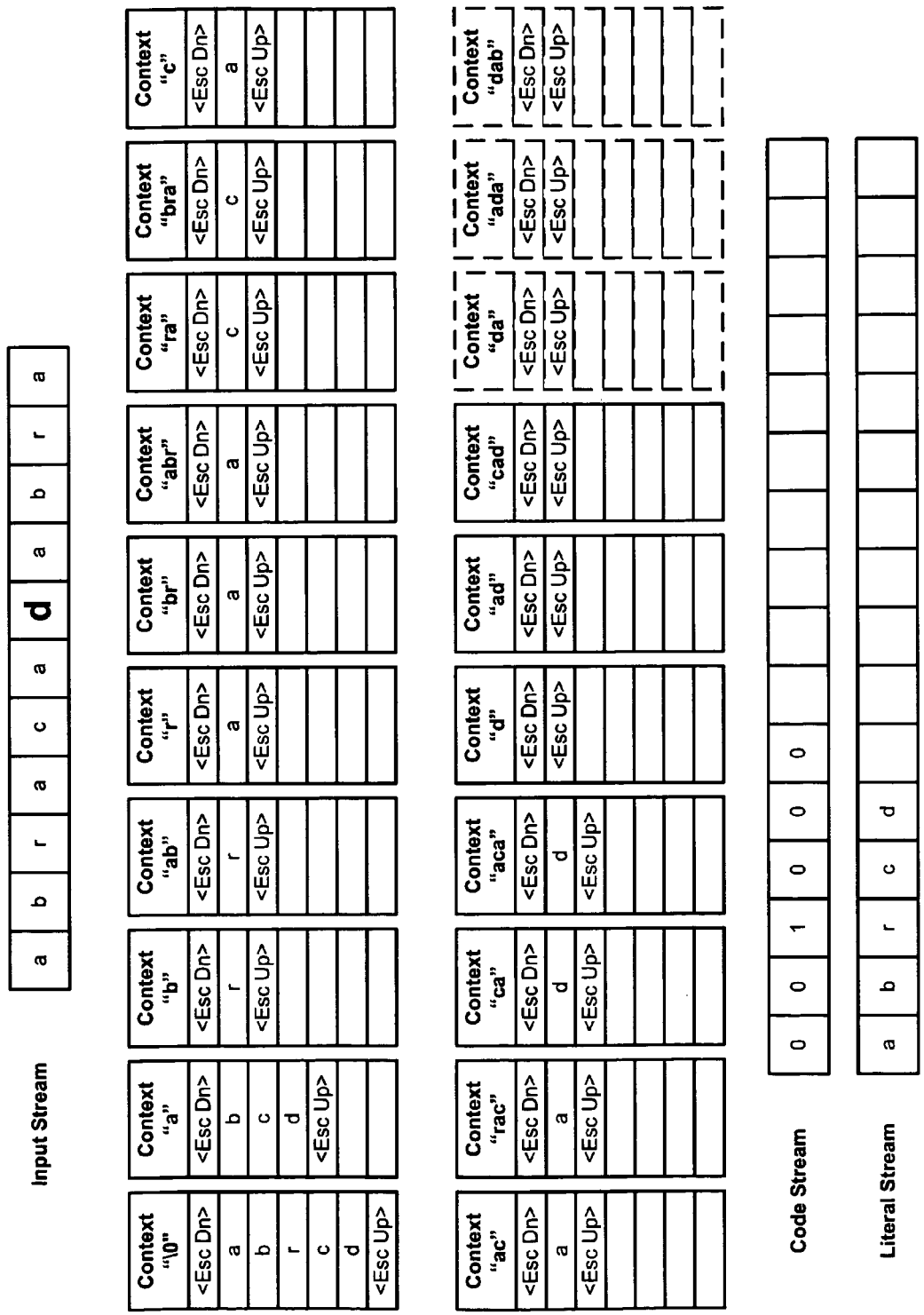

Now, we are at the next symbol "d" (e.g., abraca*d*abra). No symbol "d" in the "" context, so the encoder escapes (index 1 XOR previous index 1, yields code 0). Code stream is now 0-0-1-0-0-0 and the literals stream is now "abrcd" as shown in FIG. 6H.

Figure 6I:
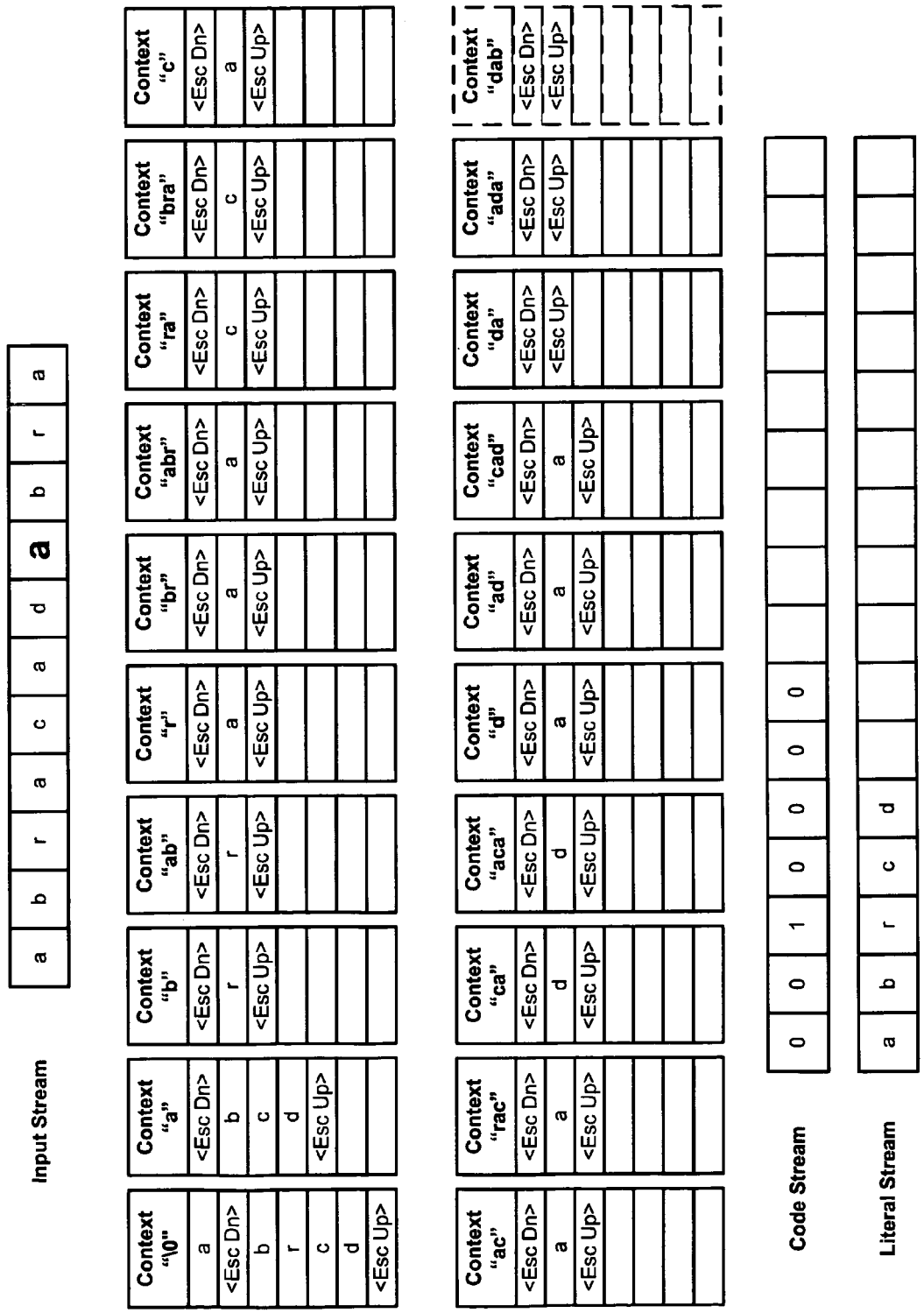

The next symbol is "a" (e.g., abracad*a*bra). Symbol "a" in the "" context is at index 1, so the code generated is again 0 (previous index of 1 XOR current index of 1). The code stream is now 0-0-1-0-0-0-0 and the literals stream stays "abrcd" as shown in FIG. 6I.

At this point, there are enough statistics in the higher-order contexts that it may make sense to switch to the order 1 context. For illustrative purposes, it is assumed that the encoder decides to move to order 1 context. The index for the <esc up> is 6 in the "" context. So, the next code value to be generated (using that particular escape) is 7 (e.g., offset 6 for <Esc Up> XORed with the previous index of 1).

Figure 6J:
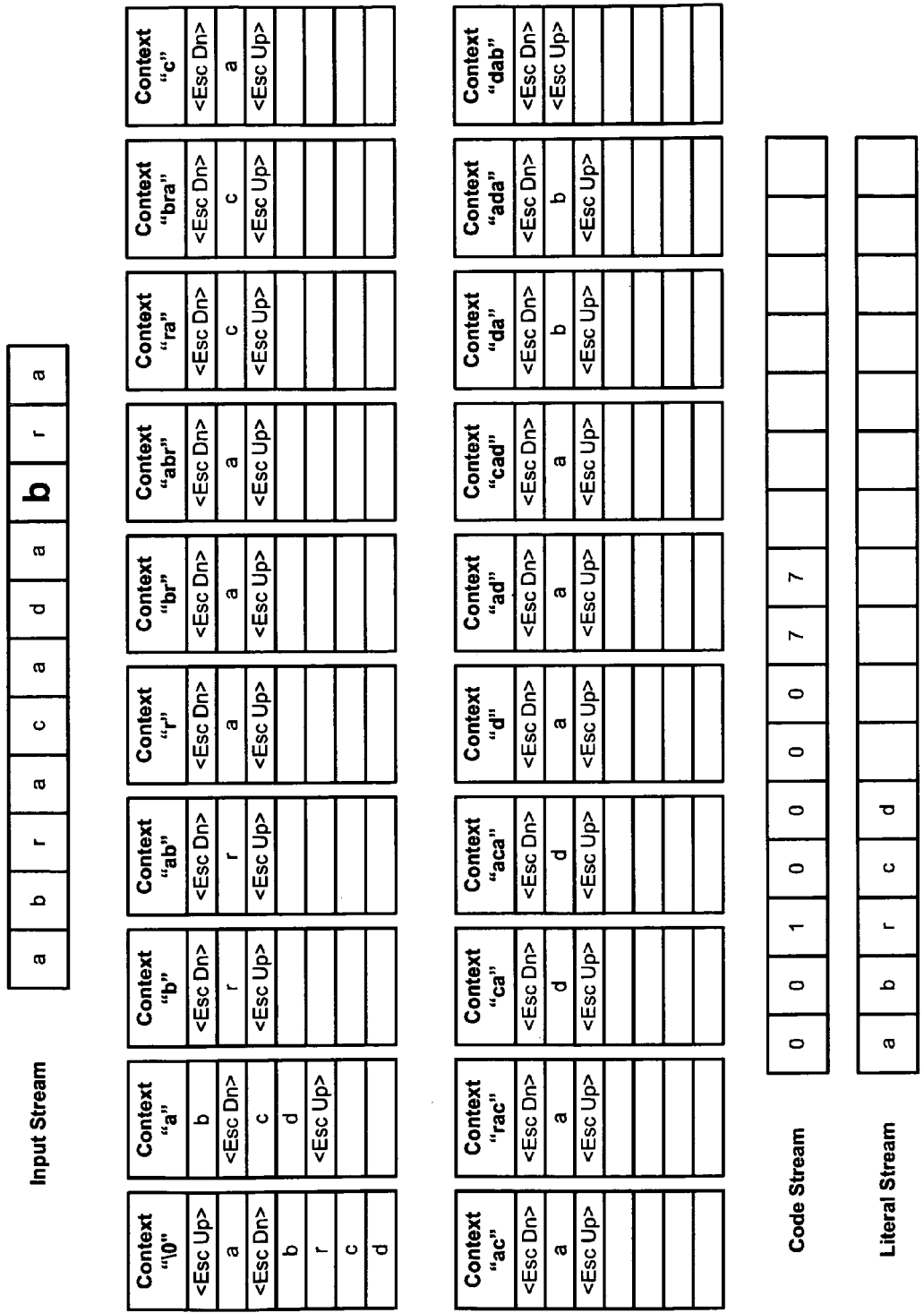

After the encoder escapes up, we are at context "a" (e.g., the context corresponding to the last symbol of "a"). Now the next symbol is "b" and the index corresponding to "b" in context "a" is 1. The code generated is 7 (e.g., index of 1 for "b" XORed with the previous index of 6). As a result, the code stream is "0-0-1-0-0-0-0-7-7" and the literal stream remains "abrcd" as shown in FIG. 6J.

Figure 6K:
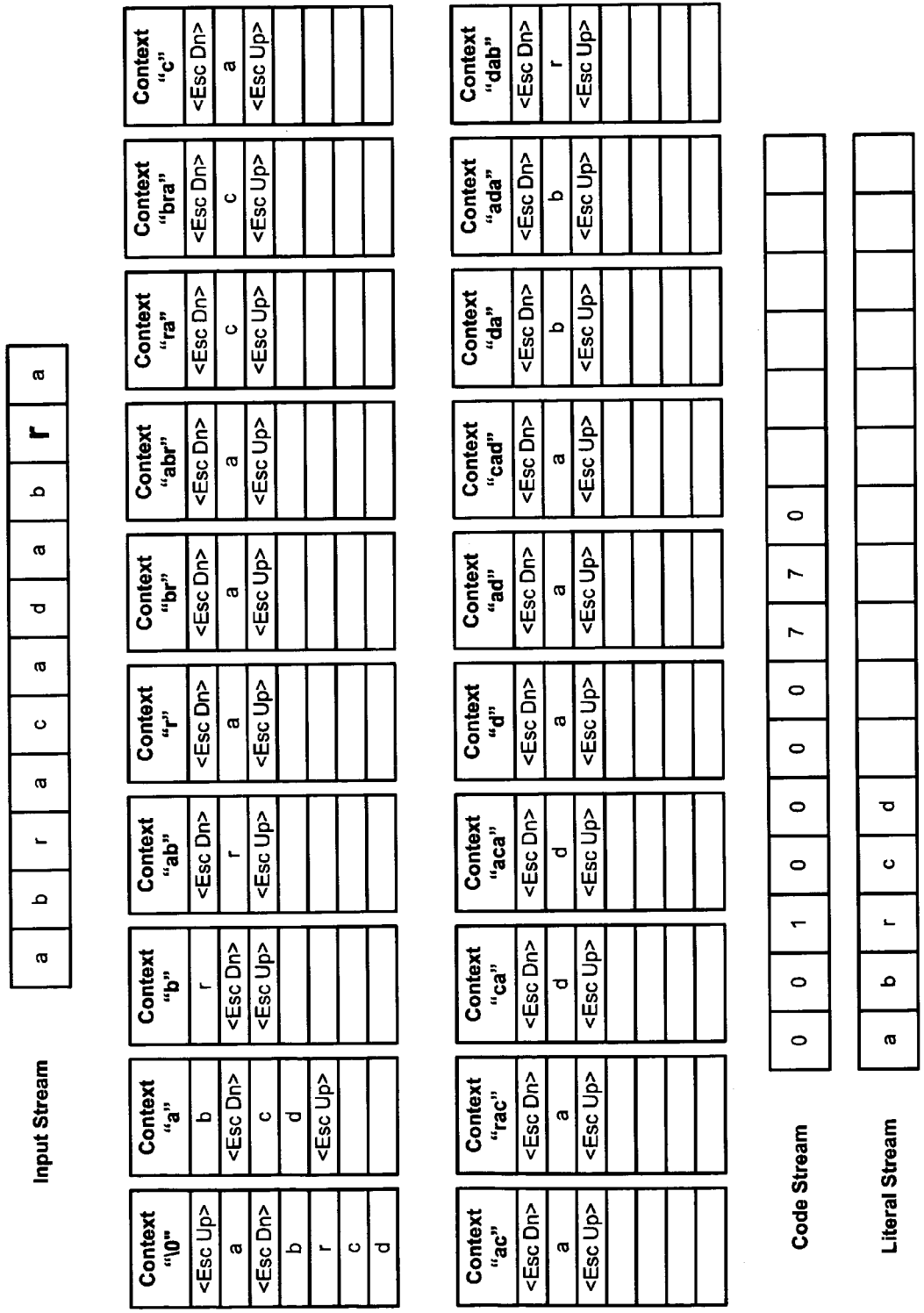

Since the encoder has escaped up by one order, the encoder stays with order 1 context. The next symbol from the input stream is "r" and the encoder starts with context "b". The code generated is 0 (e.g., index 1 for "b" XORed with the previous index of 1). Thus, the code stream is "0-0-1-0-0-0-0-7-7-0" and the literal stream remains "abrcd" as shown in FIG. 6K.

Figure 6L:
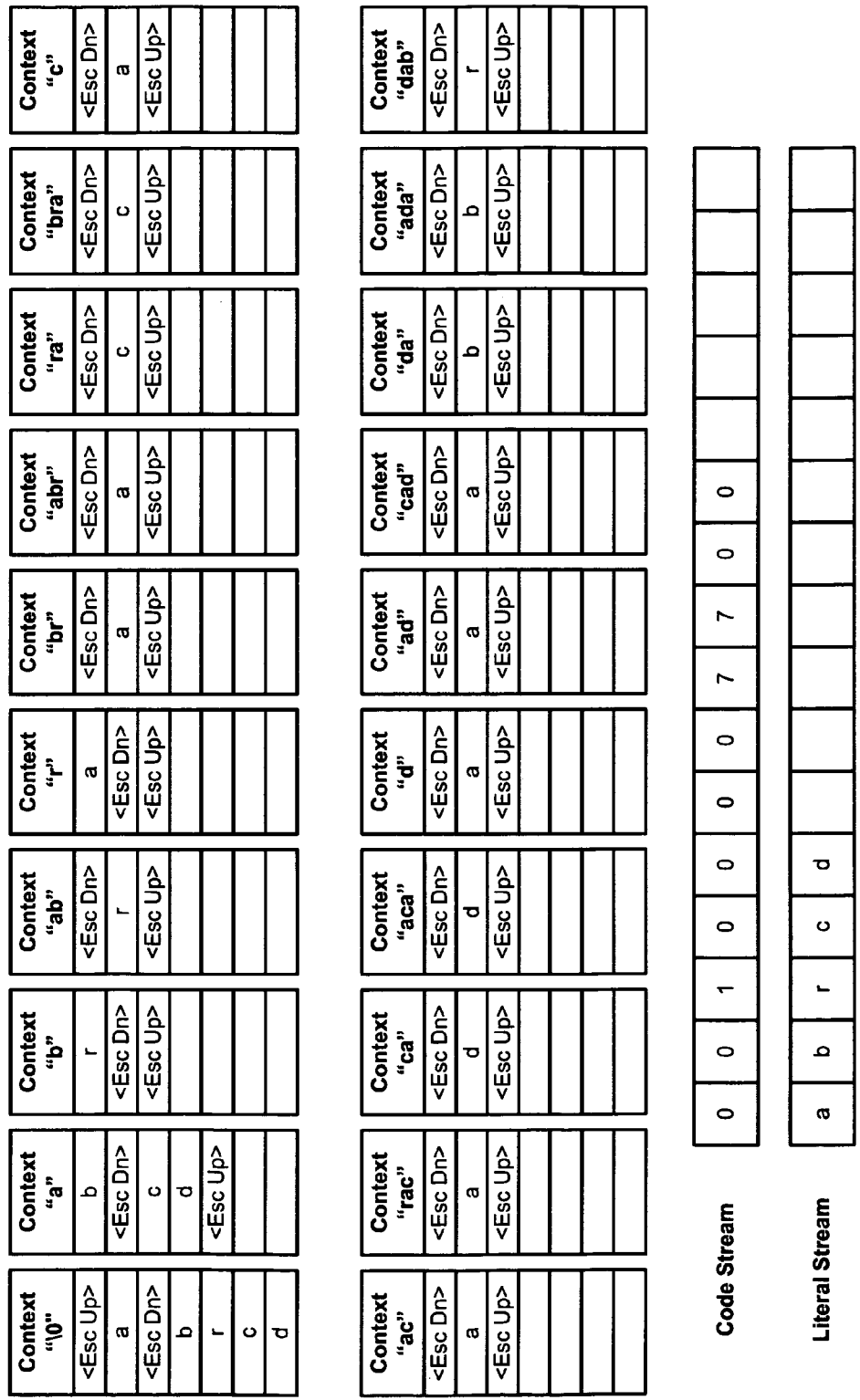

Similarly, the next symbol is "a" and the encoder starts with context "r". As a result, the code generated is 0 (e.g., index 1 for "a" XORed with the previous index of 1). Thus the code stream becomes "0-0-1-0-0-0-0-7-7-0" and the literal stream remains "abrcd" as shown in FIG. 6L. In this example, the code stream would take 37 bits to encode using a Huffman coder, and the literals would take 41 bits using the compact encoding techniques.

FIGS. 7A-7L are block diagrams illustrating a decoding process according to one embodiment of the invention. Referring to FIGS. 3-4, 7A-7L and 8B, it is assumed that, as an example, the code stream and literals stream generated from an encoder described above are to be decoded to recover data stream of "abracadabra", which may be decompressed using a variety of decompressors. Note that process as shown in FIGS. 7A-7L may be performed by a decoder which may include software, hardware, or a combination of both.

Figure 7A:
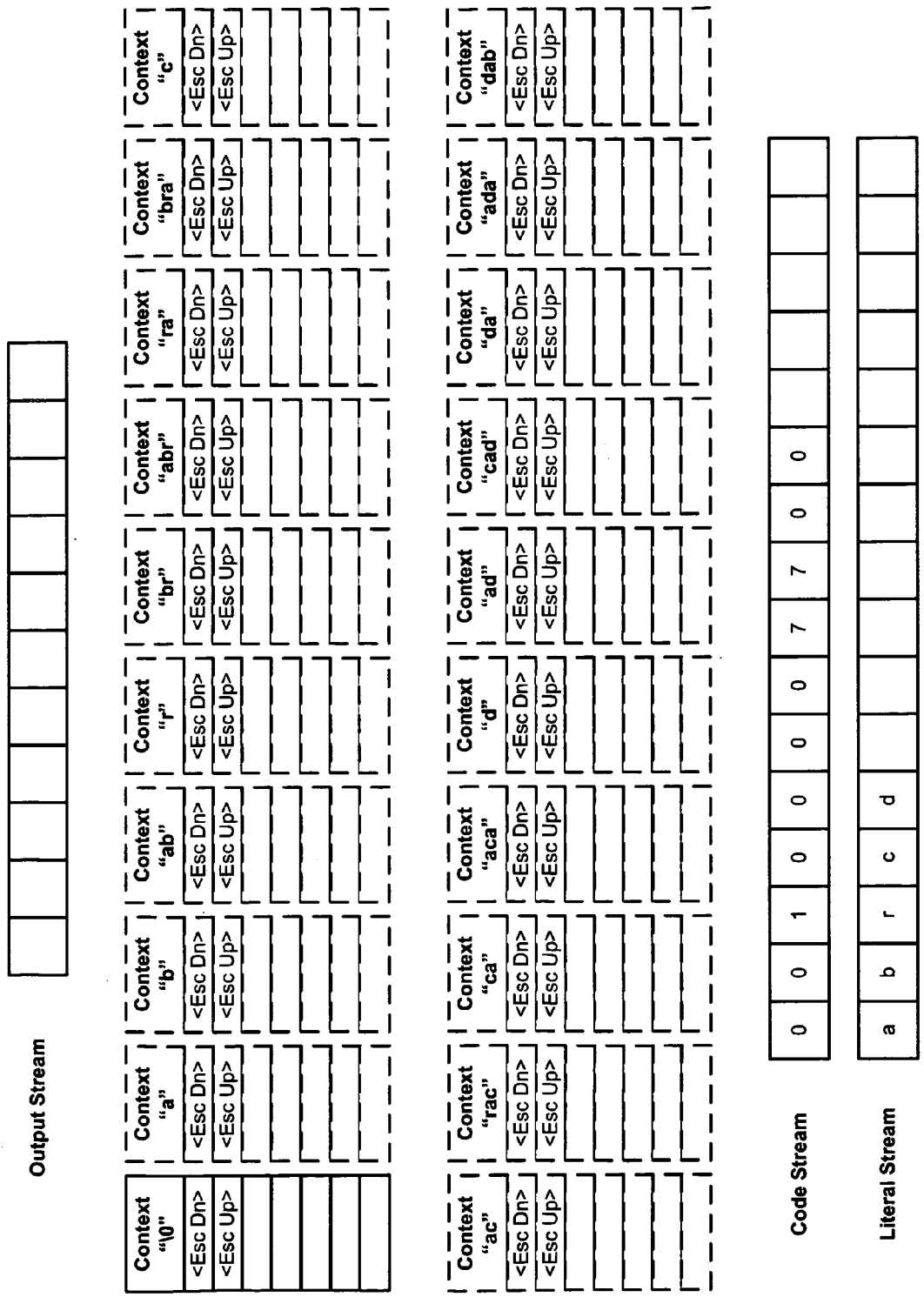
Figure 7B:
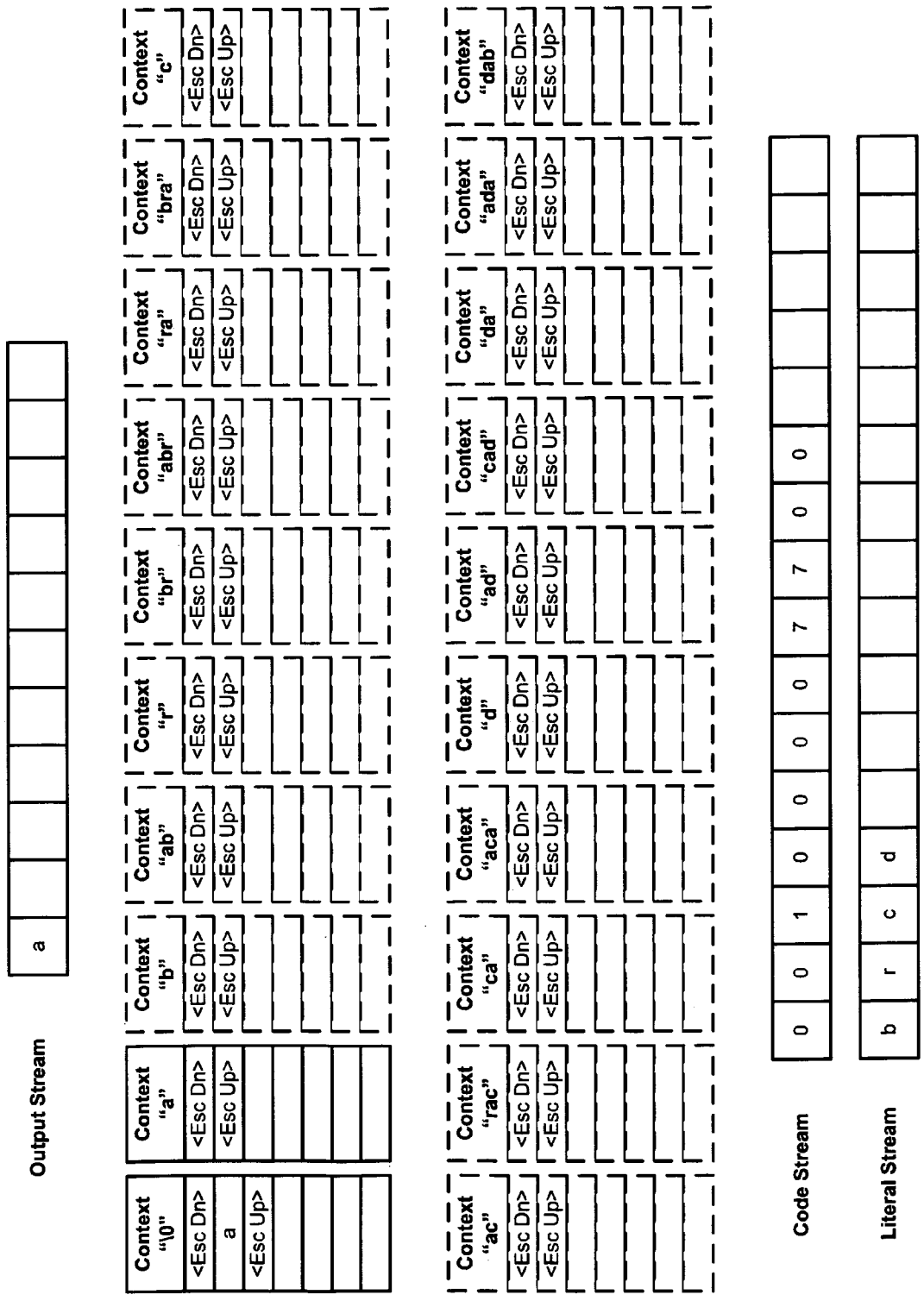

Initially, the decoder starts with the root context "" (block 852 of FIG. 8B) as shown in FIG. 7A. At this point, context "" cannot code anything other than an escape token (block 854). As a result, a next literal "a" is retrieved from the literal stream (block 868) and output to the output stream (block 870). Then "a" is added to context "" and child context "a" is created (block 874), as shown in FIG. 7B.

Figure 7C:
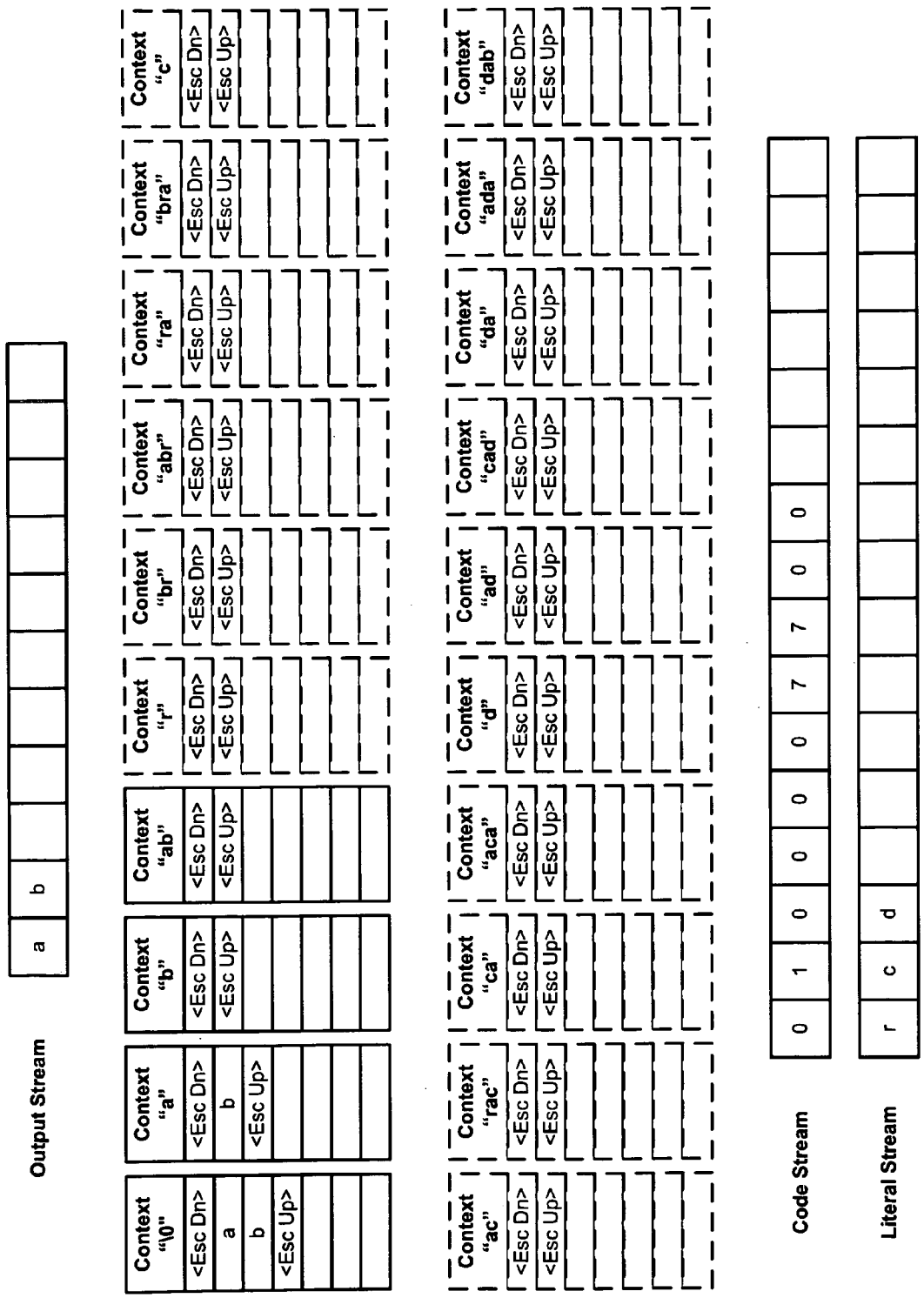

Since the decoder does not "escape up", the decoder stays with the same order of context "". Now at block 854, since context "" can in fact code something other than an escape token, at block 856, a code is consumed from the code stream, which is "0" and not an EOS. An index is generated by XORing code "0" with a previous index (implicitly zero) which is 0 (block 860). The generated index corresponds to an escape down token. Thus, a next literal "b" is consumed from the literal stream (blocks 862, 876, and 864) and output to the output stream (block 870). Thereafter, "b" is added to context "" and child contexts are created (block 874), as shown in FIG. 7C.

Figure 7D:
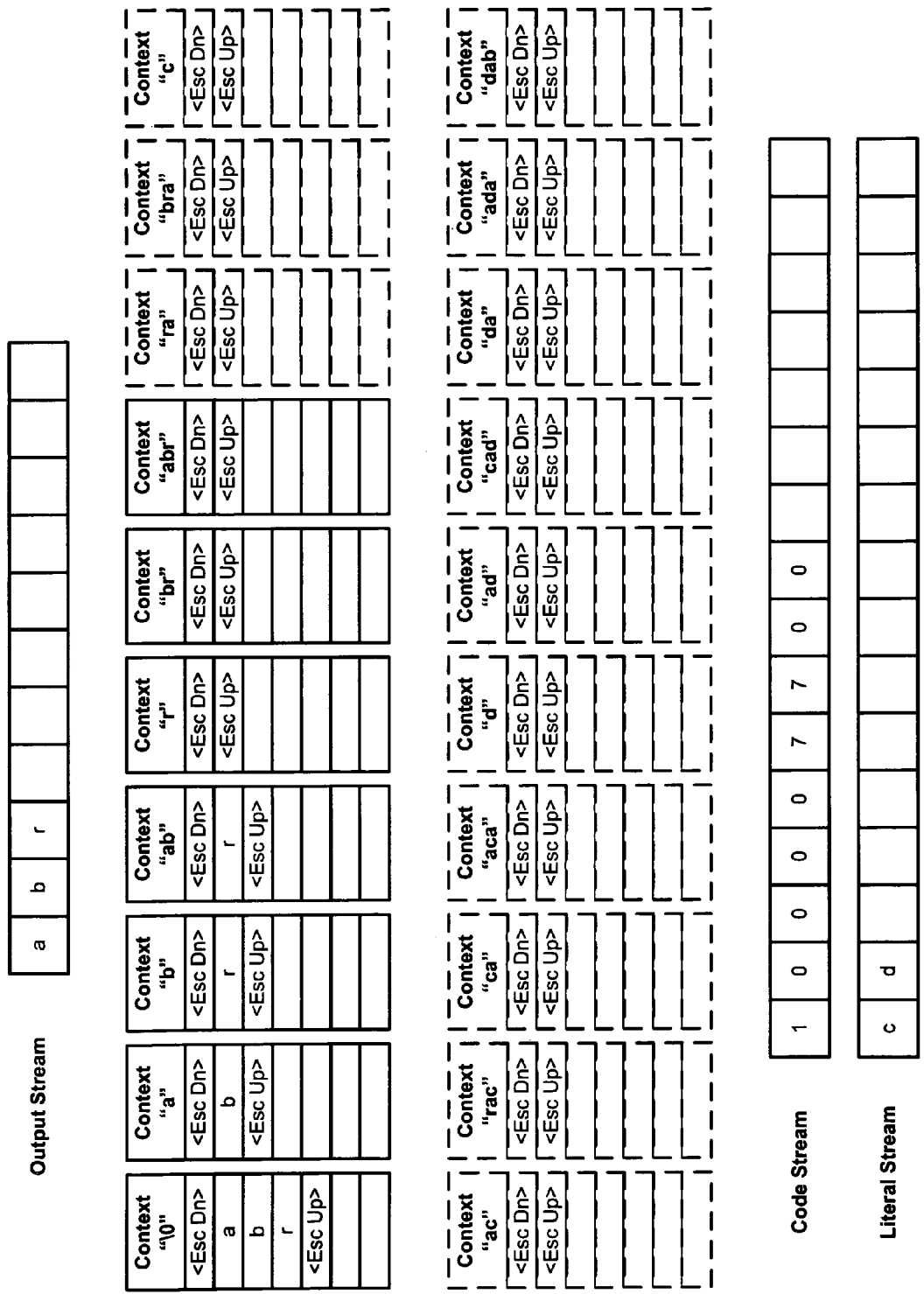

Again the decoder stays with the same order of contexts until it "escapes up", which will be described in details further below. Since context "" can code something other than an escape, the next code "0" is consumed from the code stream and the resulted index is 0 (0 XORed with previous index of 0). As a result, a next literal "r" is consumed from the literal stream and output to the output stream (blocks 854, 856, 860, 864, and 870) and the corresponding contexts are updated (block 874), as shown in FIG. 7D.

Figure 7E:
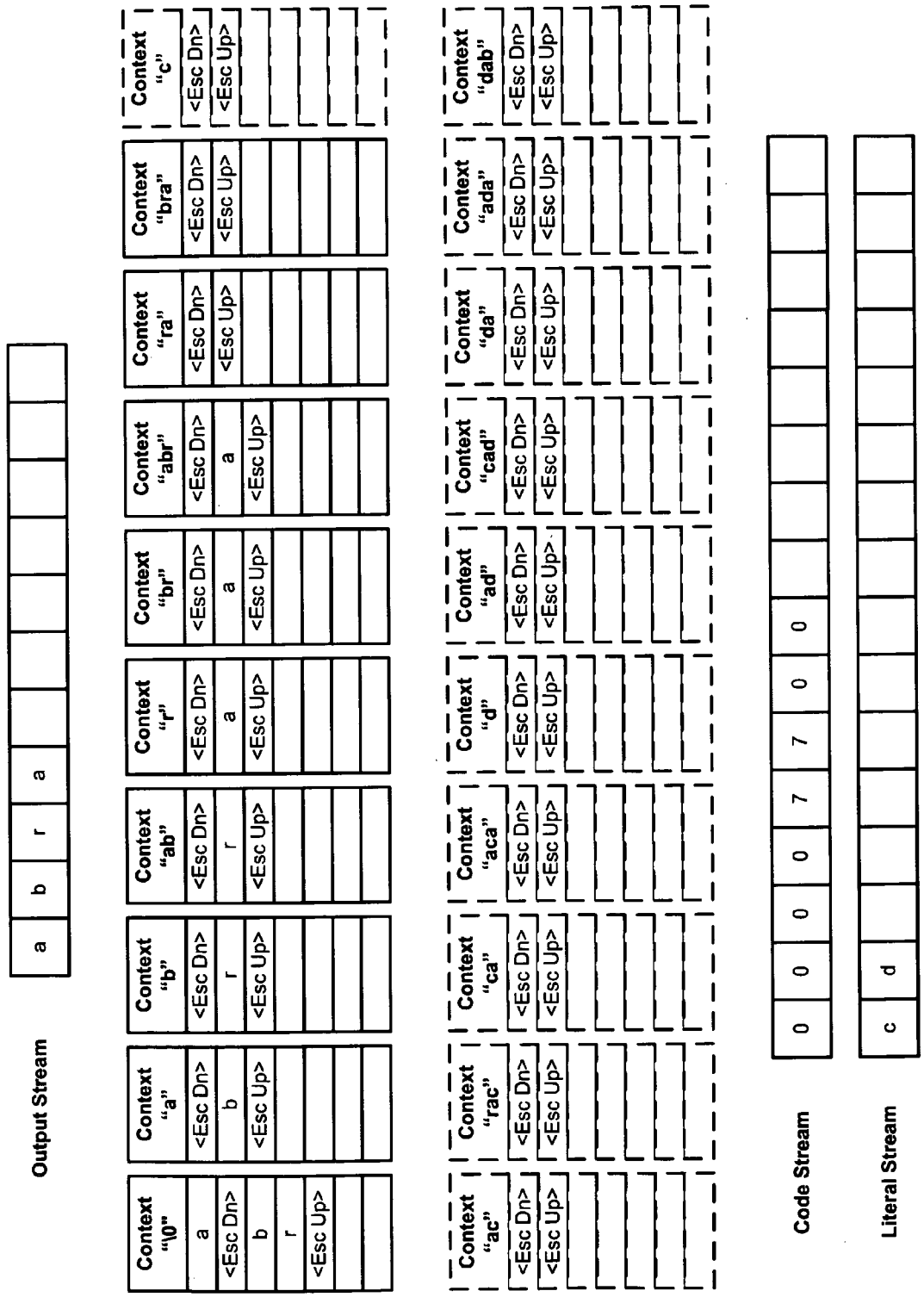
Figure 7F:
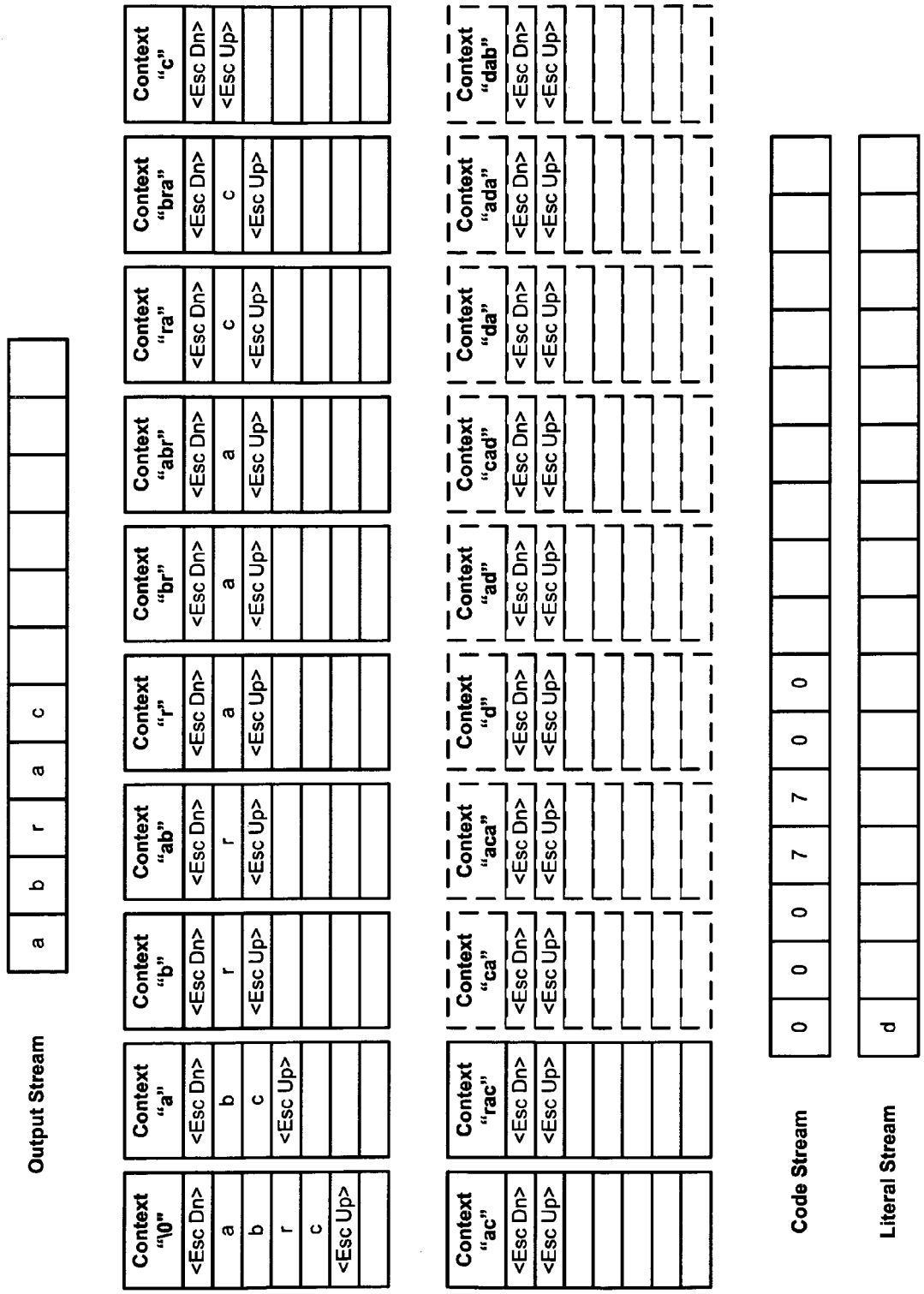

Next, since context "" can code something other than an escape, the next code "1" is consumed from the code stream and the resulted index is 1 (1 XORed with previous index of 0), which corresponds to literal "a" in context "" (block 864). Thus, "a" is output to the output stream and the corresponding contexts are updated, including moving "a" entry up front at index 0 in context "", as shown in FIG. 7E.

Figure 7G:
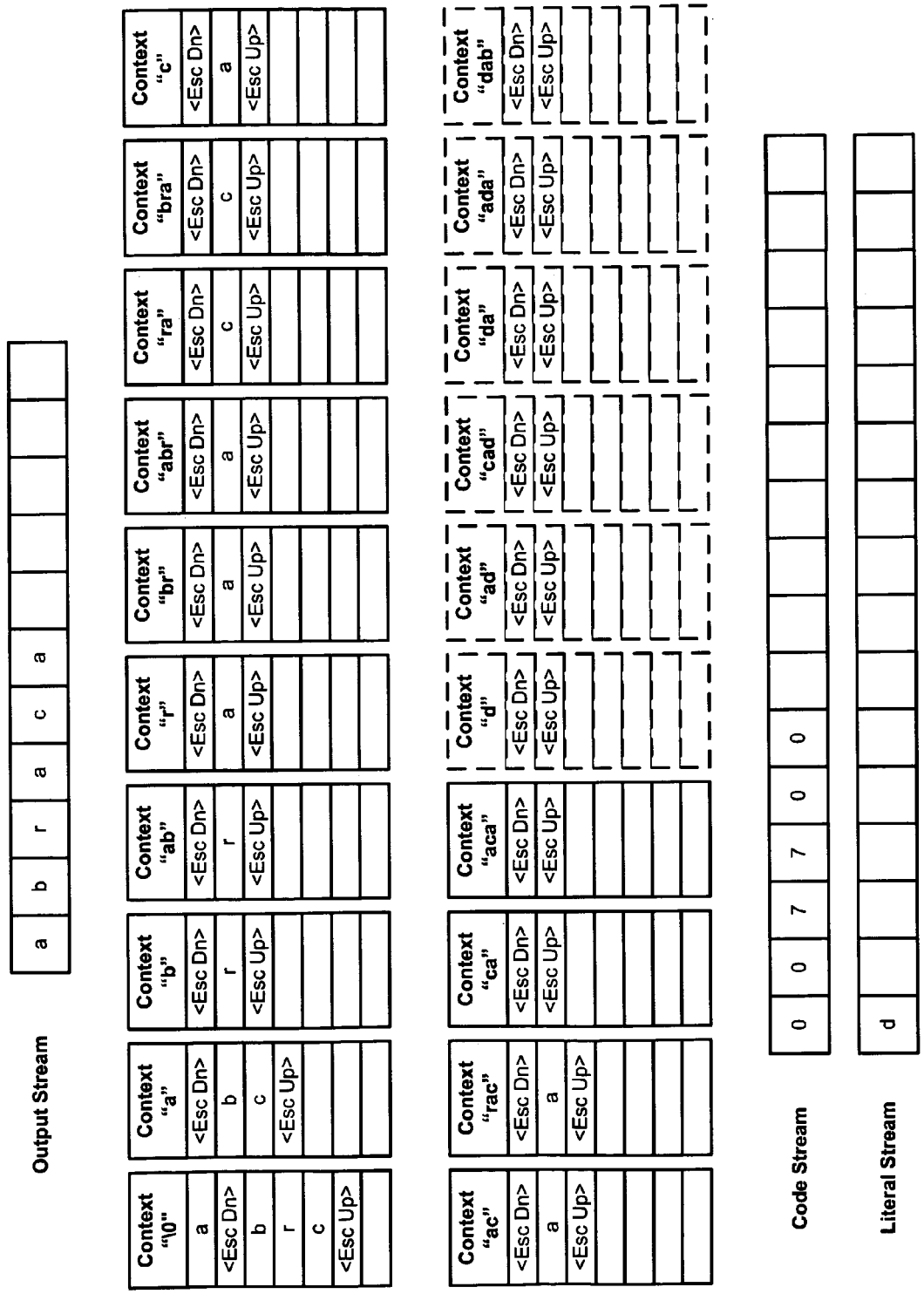
Figure 7H:
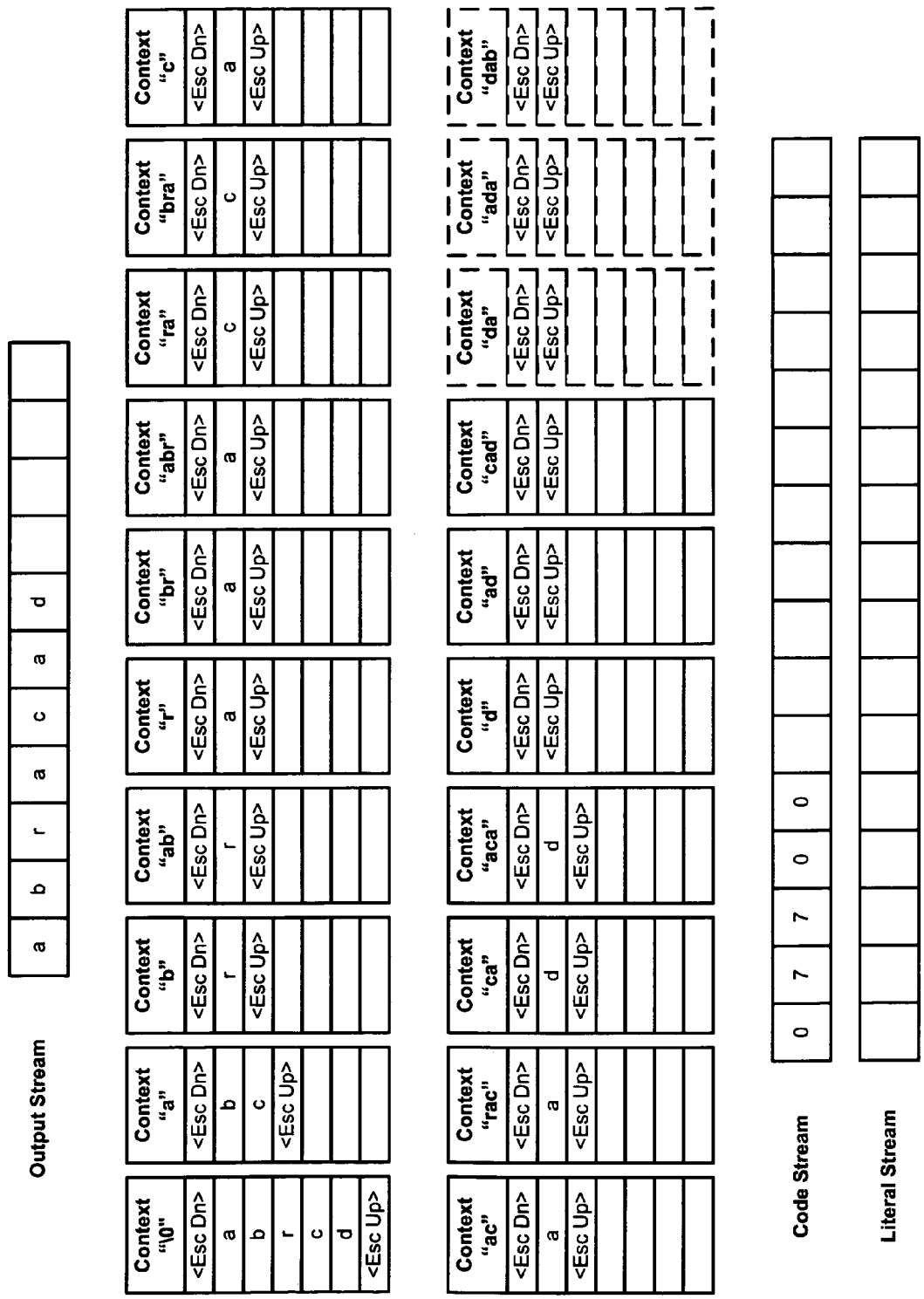
Figure 71:
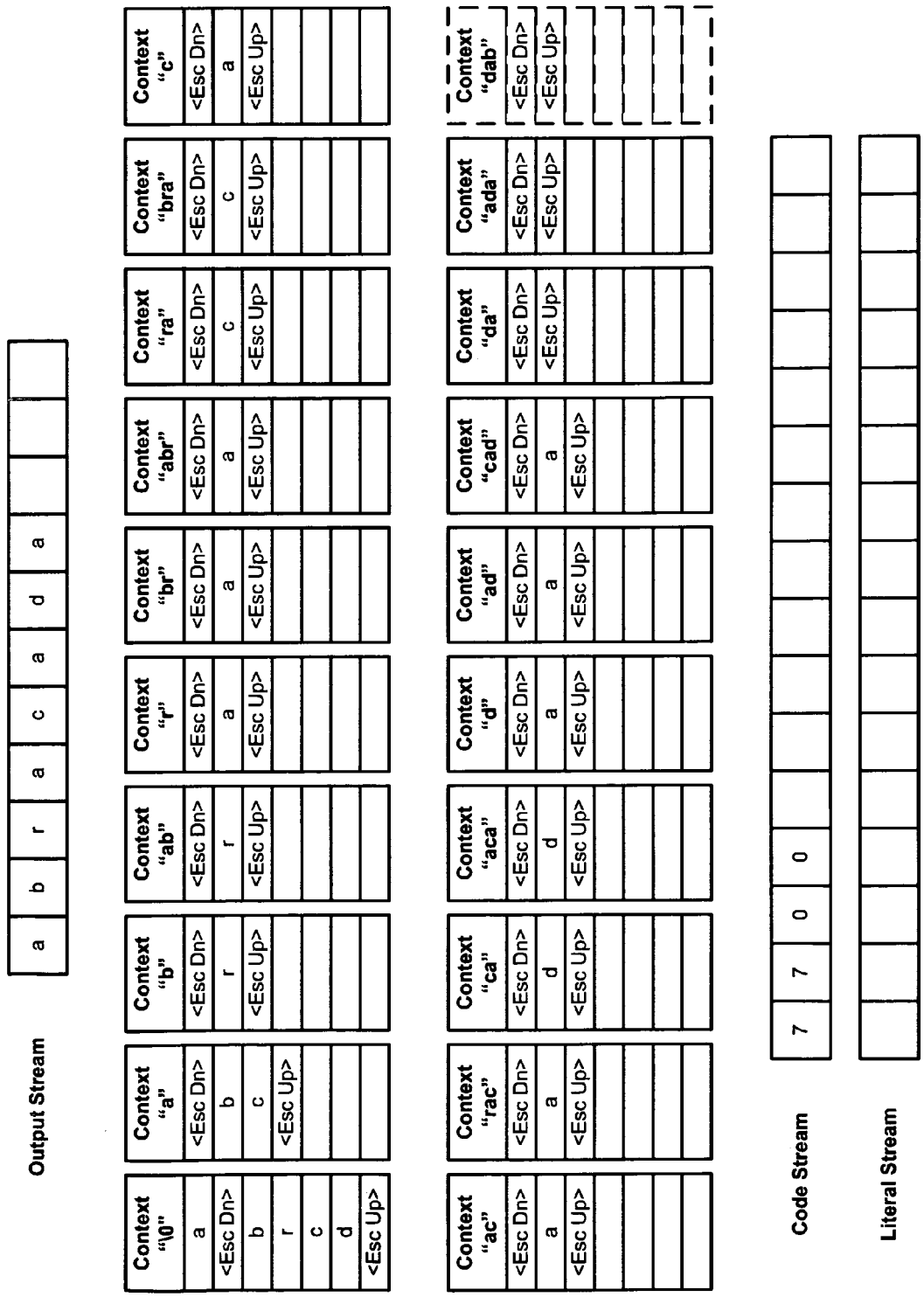

The above processes are repeated for next literals "cada" as shown in FIGS. 7G-7I according to the operation flows shown in FIG. 8B. At this point, the remaining code stream is "7-7-0-0" and no more literal is in the literal stream as shown in FIG. 7I. At this point, the decoder stays with context "". Since context "" can code something other than an escape token (block 854), a next code "7" is consumed from the code stream (block 856). Since the code is not an EOS (end of stream) at block 858, the code is XORed with the previous index which results in index 6 (7 XORed with previous index of 1). The symbol corresponding to index 6 in context "" is an escape up (<Esc Up>) token. As a result, the decoder "escapes up" by one order of contexts (blocks 862, 866, and 874).

Figure 7J:
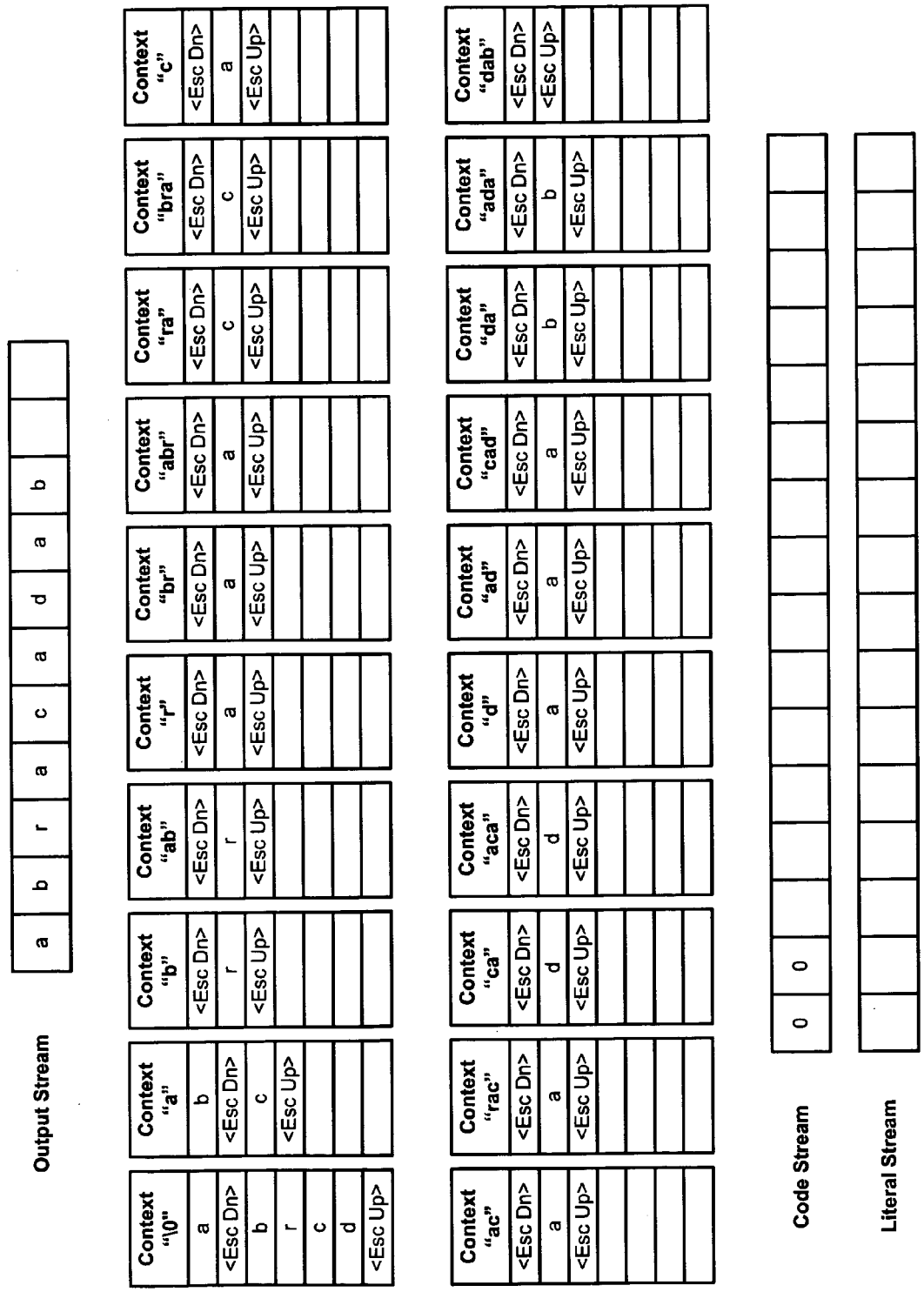

As a result, the decoder starts with a higher order context "a" (e.g., the context corresponding to the last literal placed in the output stream). Again, context "a" can code something other than an escape token (block 854), a next code of "7" is consumed from the code stream (block 856), which generates an index of 1 (7 XORed previous index of 6). The entry at index 1 in context "a" contains symbol "b". As a result, "b" is output to the output stream (blocks 864, 870, and 874) as shown in FIG. 7J.

Figure 7K:
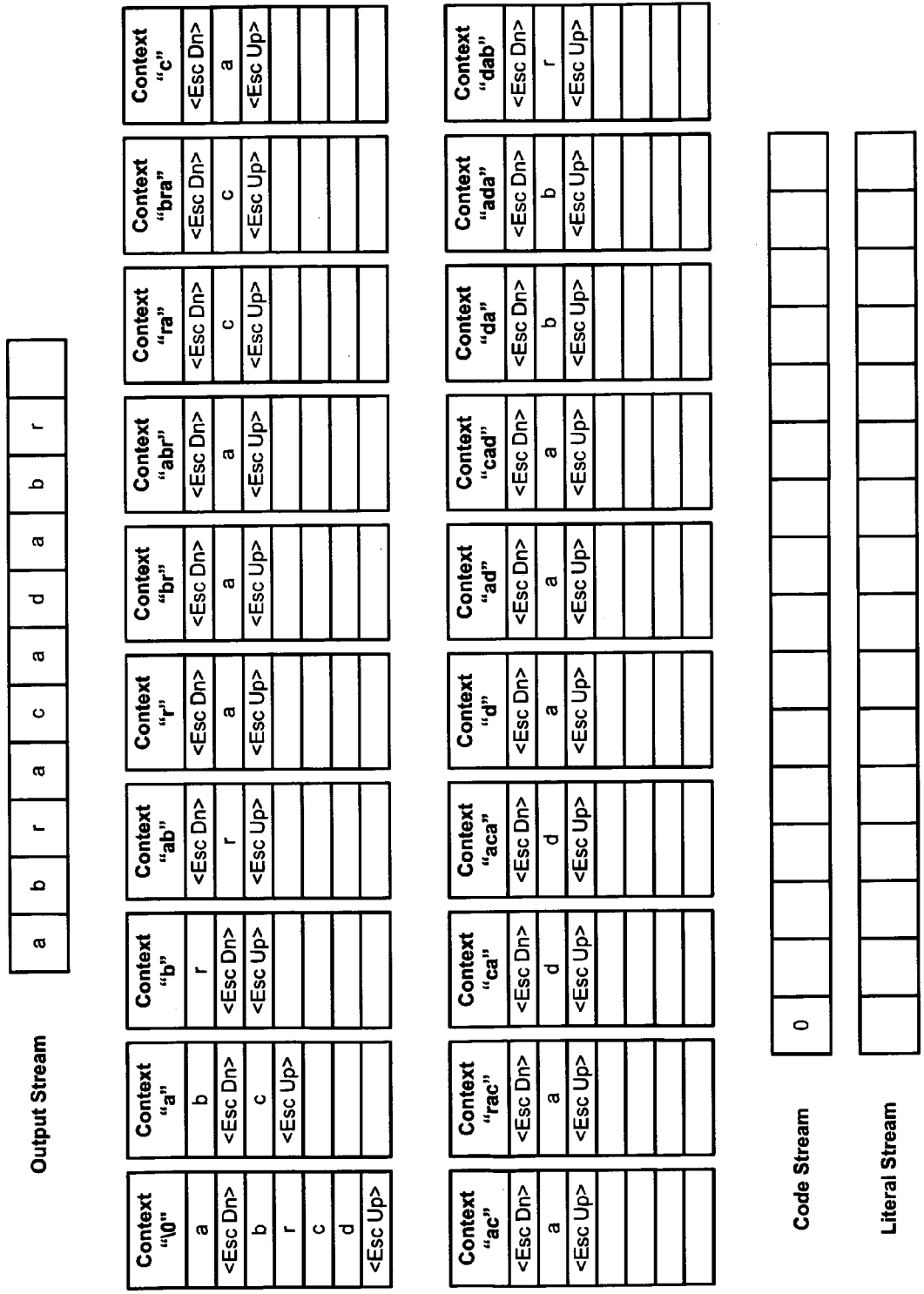
Figure 7L:
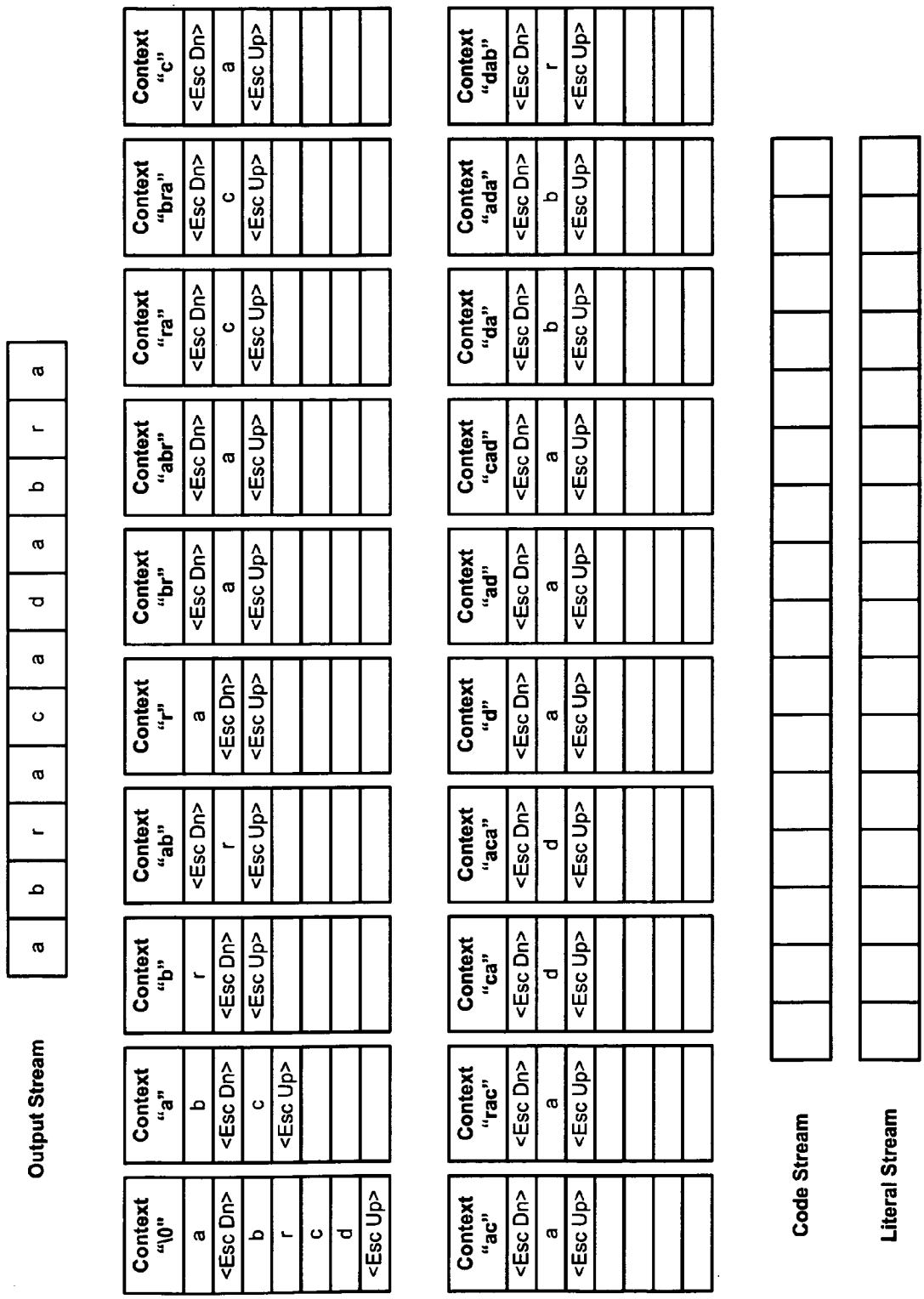
Figure 8A:
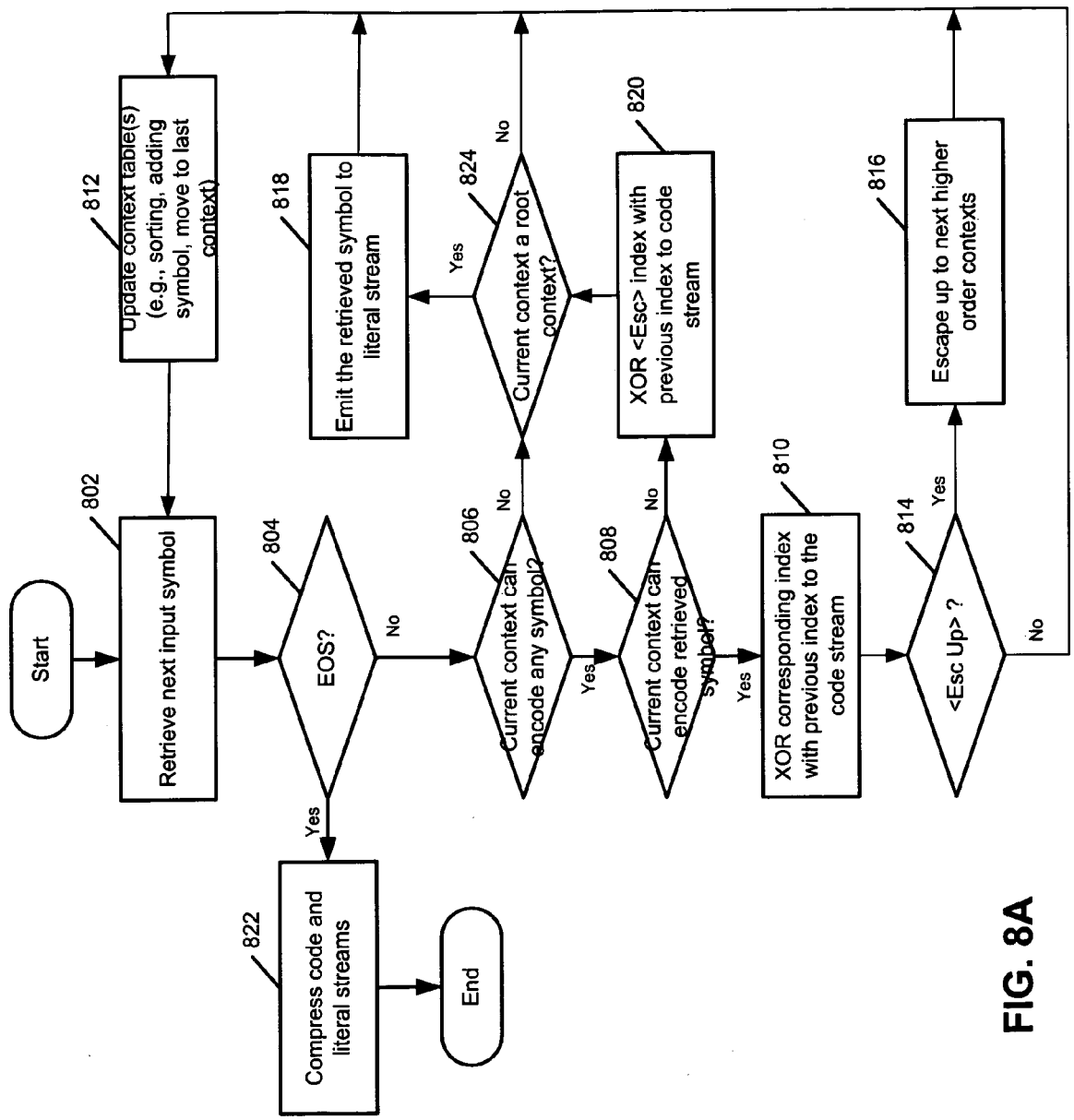

Again, the decoder stays with the same order of contexts and starts with context "b" at this point, since "b" is the last symbol output into the output stream. Base on the next code "0" consumed from the code stream, "r" is output to output stream as shown in FIG. 7K. Finally, the decoder starts with context "r" based on the last code "0" consumed from the code stream and outputs "a" to the output stream as shown in FIG. 7L. At this point, no more literal is left in the literal stream (block 858).

Figure 9:
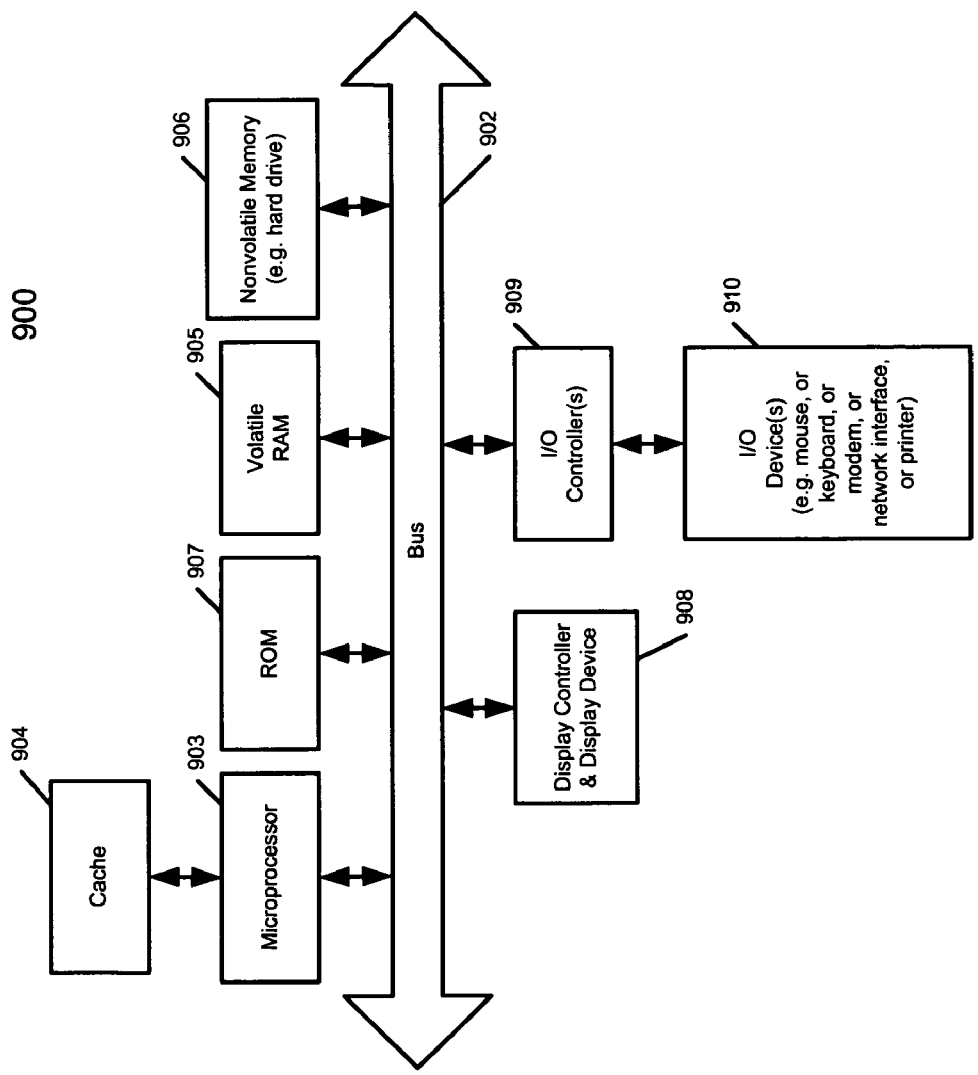
FIG. 9 is a block diagram illustrating an example of a data process system which may be used with one embodiment of the invention.

FIG. 9 illustrates a diagrammatic representation of a machine in the exemplary form of a computer system within which a set of instructions, for causing the machine to perform any one or more of the methodologies discussed herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies discussed herein. For example, the system 900 may be used as part of system, either an encoder or a decoder, to perform the coding processes set forth above.

As shown in FIG. 9, the system 900, which is a form of a data processing system, includes a bus or interconnect 902 which is coupled to one or more microprocessors 903 and a ROM 907, a volatile RAM 905, and a non-volatile memory 906. The microprocessor 903 is coupled to cache memory 904 as shown in the example of FIG. 9. Processor 903 may be, for example, a PowerPC microprocessor or an Intel compatible processor. Alternatively, processor 903 may be a digital signal processor or processing unit of any type of architecture, such as an ASIC (Application-Specific Integrated Circuit), a CISC (Complex Instruction Set Computing), RISC (Reduced Instruction Set Computing), VLIW (Very Long Instruction Word), or hybrid architecture, although any appropriate processor may be used.

The bus 902 interconnects these various components together and also interconnects these components 903, 907, 905, and 906 to a display controller and display device 908, as well as to input/output (I/O) devices 910, which may be mice, keyboards, modems, network interfaces, printers, and other devices which are well-known in the art.

Typically, the input/output devices 910 are coupled to the system through input/output controllers 909. The volatile RAM 905 is typically implemented as dynamic RAM (DRAM) which requires power continuously in order to refresh or maintain the data in the memory. The non-volatile memory 906 is typically a magnetic hard drive, a magnetic optical drive, an optical drive, or a DVD RAM or other type of memory system which maintains data even after power is removed from the system. Typically, the non-volatile memory will also be a random access memory, although this is not required.

While FIG. 9 shows that the non-volatile memory is a local device coupled directly to the rest of the components in the data processing system, embodiments of the present invention may utilize a non-volatile memory which is remote from the system; such as, a network storage device which is coupled to the data processing system through a network interface such as a modem or Ethernet interface. The bus 902 may include one or more buses connected to each other through various bridges, controllers, and/or adapters, as is well-known in the art. In one embodiment, the I/O controller 909 includes a USB (Universal Serial Bus) adapter for controlling USB peripherals. Alternatively, I/O controller 909 may include an IEEE-1394 adapter, also known as FireWire adapter, for controlling FireWire devices.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments of the present invention also relate to an apparatus for performing the operations herein. This apparatus may be specially constructed for the required purposes, or it may comprise a general-purpose computer selectively activated or reconfigured by a computer program stored in the computer. Such a computer program may be stored in a computer readable medium. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., carrier waves, infrared signals, digital signals, etc.)), etc.

The algorithms and displays presented herein are not inherently related to any particular computer or other apparatus. Various general-purpose systems may be used with programs in accordance with the teachings herein, or it may prove convenient to construct more specialized apparatus to perform the required method operations. The required structure for a variety of these systems will appear from the description below. In addition, embodiments of the present invention are not described with reference to any particular programming language. It will be appreciated that a variety of programming languages may be used to implement the teachings of embodiments of the invention as described herein.

In the foregoing specification, embodiments of the invention have been described with reference to specific exemplary embodiments thereof. It will be evident that various modifications may be made thereto without departing from the broader spirit and scope of embodiments of the invention as set forth in the following claims. The specification and drawings are, accordingly, to be regarded in an illustrative sense rather than a restrictive sense.

What is claimed is:

1. A computer implemented method for encoding data, the method comprising:
   in response to a symbol retrieved from an input stream having a sequence of symbols, determining whether a current context can encode the retrieved symbol, wherein the current context is a context associated with a previously emitted symbol from the input stream;
   emitting a code representing an escape down token in the current context to a code stream if the current context cannot encode the retrieved symbol, wherein the emitted code representing the escape down token is used by a decoder to switch from a higher order context to a lower order context during decoding the code stream;

emitting a code representing the retrieved symbol in the current context to the code stream if the current context can encode the retrieved symbol; and optionally escaping to a context having a higher order by emitting a code representing an escape up token in the code stream, wherein a higher order context is a child context to a lower order context as a parent context, wherein the emitted code representing the escape up token is used by the decoder to switch from a lower order context to a higher order context during decoding the code stream.

2. The method of claim 1, further comprising:

determining whether the current context can encode anything other than an escape down token and/or an escape up token;

determining whether the current context is a root context;

emitting the retrieved symbol in a literal stream if the current context is the root context and if the current context cannot encode anything other than an escape down token and/or an escape up token; and implicitly emitting an escape down token if the current context is not the root context and if the current context cannot encode anything other than an escape up token and/or an escape down token.

3. The method of claim 2, further comprising sorting the current context by moving an entry associated with the emitted code or emitted symbol up front at index zero.

4. The method of claim 2, wherein for each symbol retrieved from the input stream, a context associated with a previous emitted symbol at an identical order is selected as the current context, until the current context is escaped up by emitting a code representing an escape up token.

5. The method of claim 1, wherein a code representing the retrieved symbol is generated by performing an exclusive OR operation between the index associated with the retrieved symbol with a previous index used in a previous iteration.

6. A computer readable medium including instructions that, when executed by a processing system, cause the processing system to perform a method for encoding data, the method comprising:

in response to a symbol retrieved from an input stream having a sequence of symbols, determining whether a current context can encode the retrieved symbol, wherein the current context is a context associated with a previously emitted symbol from the input stream;

emitting a code representing an escape down token in the current context to a code stream if the current context cannot encode the retrieved symbol, wherein the emitted code representing the escape down token is used by a decoder to switch from a higher order context to a lower order context during decoding the code stream;

emitting a code representing the retrieved symbol in the current context to the code stream if the current context can encode the retrieved symbol; and optionally escaping to a context having a higher order by emitting a code representing an escape up token in the code stream, wherein a higher order context is a child context to a lower order context as a parent context, wherein the emitted code representing the escape up token is used by the decoder to switch from a lower order context to a higher order context during decoding the code stream.

7. The computer readable medium of claim 6, wherein the method further comprises:

determining whether the current context can encode anything other than an escape down token and/or an escape up token;

determining whether the current context is a root context;

emitting the retrieved symbol in a literal stream if the current context is the root context and if the current context cannot encode anything other than an escape down token and/or an escape up token; and implicitly emitting an escape down token if the current context is not the root context and if the current context cannot encode anything other than an escape up token and/or an escape down token.

8. The computer readable medium of claim 7, wherein the method further comprises sorting the current context by moving an entry associated with the emitted code or emitted symbol up front at index zero.

9. The computer readable medium of claim 7, wherein for each symbol retrieved from the input stream, a context associated with a previous emitted symbol at an identical order is selected as the current context, until the current context is escaped up by emitting a code representing an escape up token.

10. The computer readable medium of claim 6, wherein a code representing the retrieved symbol is generated by performing an exclusive OR operation between the index associated with the retrieved symbol with a previous index used in a previous iteration.

11. A computer implemented method for decoding data, the method comprising:

in response to a code stream and a literal stream, determining whether a current context can code anything other than an escape down token and/or an escape up token;

consuming a code from the code stream if the current context can code anything other than the escape down token and/or the escape up token;

escaping up from the current context to a higher order context to be a next current context if the consumed code represents an escape up token in the current context; and emitting a literal from the literal stream to an output stream if the current context cannot code anything other than the escape down token and/or the escape up token and if the current context is a root context.

12. The method of claim 11, further comprising generating an index based on the code consumed from the code stream, including performing an exclusive OR (XOR) operation between the consumed code and a previous index used in a previous iteration.

13. The method of claim 12, further comprising emitting a symbol from the current context to the output stream, wherein the symbol is located at an entry indicated by the generated index.

14. The method of claim 12, wherein escaping up is performed if the generated index corresponding to an entry of the escape up token within the current context.

15. The method of claim 12, further comprising sorting the current context based on the emitted literal and/or consumed code, including moving a corresponding entry associated with the emitted literal and/or consumed code up front at index zero.

16. A computer readable medium including instructions that, when executed by a processing system, cause the processing system to perform a method for decoding data, the method comprising:

in response to a code stream and a literal stream, determining whether a current context can code anything other than an escape down token and/or an escape up token;

consuming a code from the code stream if the current context can code anything other than the escape down token and/or the escape up token;

escaping up from the current context to a higher order context to be a next current context if the consumed code represents an escape up token in the current context; and emitting a literal from the literal stream to an output stream if the current context cannot code anything other than the escape down token and/or the escape up token and if the current context is a root context.

17. The computer readable medium of claim 16, wherein the method further comprises generating an index based on the code consumed from the code stream, including performing an exclusive OR (XOR) operation between the consumed code and a previous index used in a previous iteration.

18. The computer readable medium of claim 17, wherein the method further comprises emitting a symbol from the current context to the output stream, wherein the symbol is located at an entry indicated by the generated index.

19. The computer readable medium of claim 17, wherein escaping up is performed if the generated index corresponding to an entry of the escape up token within the current context.

20. The computer readable medium of claim 17, wherein the method further comprises sorting the current context based on the emitted literal and/or consumed code, including moving a corresponding entry associated with the emitted literal and/or consumed code up front at index zero.

* * * * *